(12) United States Patent
Sekimoto et al.

(10) Patent No.: US 11,328,876 B2
(45) Date of Patent: May 10, 2022

(54) LIGHT-ABSORBING MATERIAL CONTAINING COMPOUND WITH PEROVSKITE STRUCTURE AND SOLAR CELL INCLUDING THE SAME

(71) Applicant: Panasonic Intellectual Property Management Co., Ltd., Osaka (JP)

(72) Inventors: Takeyuki Sekimoto, Osaka (JP); Michio Suzuka, Kyoto (JP); Tomoyasu Yokoyama, Osaka (JP); Yoshiko Miyamoto, Osaka (JP); Taisuke Matsui, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 120 days.

(21) Appl. No.: 16/035,597

(22) Filed: Jul. 14, 2018

(65) Prior Publication Data

US 2019/0027317 A1    Jan. 24, 2019

(30) Foreign Application Priority Data

Jul. 20, 2017  (JP) .............................. JP2017-140978

(51) Int. Cl.
*H01G 9/20* (2006.01)
*H01L 51/00* (2006.01)
(Continued)

(52) U.S. Cl.
CPC ......... *H01G 9/2059* (2013.01); *C07F 7/2204* (2013.01); *H01L 51/005* (2013.01);
(Continued)

(58) Field of Classification Search
CPC .. H01I 51/4226; H01I 51/005; H01I 51/0077; H01I 51/0035; H01I 51/4253; H01I 51/00; H01G 9/2059; C07F 7/204
See application file for complete search history.

(56) References Cited

U.S. PATENT DOCUMENTS 5,101,255 A  *  3/1992  Ishioka ................. H01L 31/095
                                                              136/258
2015/0249170 A1    9/2015  Snaith et al.
(Continued)

FOREIGN PATENT DOCUMENTS

CN        105384917        *  3/2016
JP        2015-535390         12/2015
(Continued)

OTHER PUBLICATIONS

Saidaminov et al. high quality bulk hybrid perovskite single crystals within minutes by inverse temperature crystallization, Mar. 2015.*
(Continued)

*Primary Examiner* — Uyen M Tran
(74) *Attorney, Agent, or Firm* — Renner, Otto, Boisselle & Sklar, LLP

(57) ABSTRACT

A light-absorbing material contains a compound represented by the composition formula $HC(NH_2)_2SnI_3$ and having a perovskite structure. A solid-state $^1H$-NMR spectrum, which is obtained by $^1H$-$^{14}N$ HMQC measurement in two-dimensional NMR at 25° C., of the compound includes a first peak at 6.9 ppm and a second peak at 7.0 ppm. A peak intensity of the first peak is equal to 80% or more of a peak intensity of the second peak.

12 Claims, 10 Drawing Sheets

(51) Int. Cl.
  *C07F 7/22* (2006.01)
  *H01L 51/42* (2006.01)
(52) U.S. Cl.
  CPC ...... *H01L 51/0077* (2013.01); *H01L 51/4226* (2013.01); *H01L 51/0035* (2013.01); *H01L 51/4253* (2013.01); *H01L 2251/308* (2013.01)

(56) References Cited

U.S. PATENT DOCUMENTS

| | | | |
|---|---|---|---|
| 2015/0340632 | A1 | 11/2015 | Etgar |
| 2016/0240436 | A1* | 8/2016 | Tanaka ............... H01L 21/76814 |
| 2016/0359119 | A1* | 12/2016 | Hayashi ............... H01L 51/4226 |

FOREIGN PATENT DOCUMENTS

| | | |
|---|---|---|
| JP | 2016-502282 | 1/2016 |
| JP | 2016-063090 | 4/2016 |
| JP | 2016-092293 | 5/2016 |

OTHER PUBLICATIONS

Hamill, Jr. et al., "Influence of Solvent Coordination on Hybrid Organic-Inorganic Perovskite Formation", ACS Energy Letters 2018, 3, 92-97.

Dang et al., "Formation of Hybrid Perovskite Tin Iodide Single Crystals by Top-Seeded Solution Growth", Angewandte Chemie International Edition, 2016, 55, 3447-3450 and Supporting Information.

Takeyuki Sekimoto et al.; "Inverse Temperature Crystallization of Formamidinium Tin Iodide: Indirect Transition State and Restriction of Cation Motion"; Cryst. Growth Des 2020, 20, pp. 874-883, published Dec. 26, 2019.

Teck Ming Koh et al., "Formamidinium tin-based perovskite with low Eg for photovoltaic applications", Journal of Materials Chemistry A, vol. 3, Jul. 3, 2015, pp. 14996-15000.

Eli Yablonovitch et al., "The Influence of the 4n2 Light Trapping Factor on Ultimate Solar Cell Efficiency", OSA Technical Digest (CD) (Optical Society of America, 2010), SWA1, Jun. 7, 2010.

Carlo Motta et al., "Revealing the role of organic cations in hybrid halide perovskite Ch3Nh3Pbl3", Nature Communications, 6, 7026, Apr. 27, 2015.

Mark T. Weller et al., "Complete structure and cation orientation in the perovskite photovoltaic methylammonium lead Iodide between 100 and 352 K", Chem Comminication, 51, Jan. 23, 2015, pp. 4180-4183.

Linn Leppert et al., "Electric Field- and Strain-Induced Rashba Effect in Hybrid Halide Perovskites", The Journal of Physical Chemistry Letters, 7, Aug. 31, 2016, pp. 3683-3689.

* cited by examiner

US 11,328,876 B2

LIGHT-ABSORBING MATERIAL CONTAINING COMPOUND WITH PEROVSKITE STRUCTURE AND SOLAR CELL INCLUDING THE SAME

BACKGROUND

1. Technical Field

The present disclosure relates to a light-absorbing material and a solar cell including the light-absorbing material.

2. Description of the Related Art

In recent years, research and development have been conducted on perovskite solar cells including perovskite crystals represented by the composition formula $AMX_3$ (A denotes a monovalent cation, M denotes a divalent cation, and X denotes a halogen anion) and their similar structures (hereinafter referred to as "perovskite compounds") as light-absorbing materials.

Teck Ming Koh and other eight persons, Journal of Materials Chemistry. A, July 2015, vol. 3, pp. 14996-15000 (hereinafter referred to as Non-patent Literature 1) discloses the use of a perovskite compound represented by $HC(NH_2)_2SnI_3$ (hereinafter sometimes abbreviated to "$FASnI_3$") as a light-absorbing material for perovskite solar cells.

SUMMARY

In one general aspect, the techniques disclosed here feature a light-absorbing material that contains a compound represented by a composition formula $HC(NH_2)_2SnI_3$ and having a perovskite structure. A solid-state $^1$H-NMR spectrum, which is obtained by $^1$H-$^{14}$N HMQC measurement in two-dimensional NMR at 25° C., of the compound includes a first peak at 6.9 ppm and a second peak at 7.0 ppm. A peak intensity of the first peak is equal to 80% or more of a peak intensity of the second peak.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

<Underlying Knowledge Forming Basis of the Present Disclosure>

The following is the underlying knowledge forming basis of the present disclosure.

Figure 1:
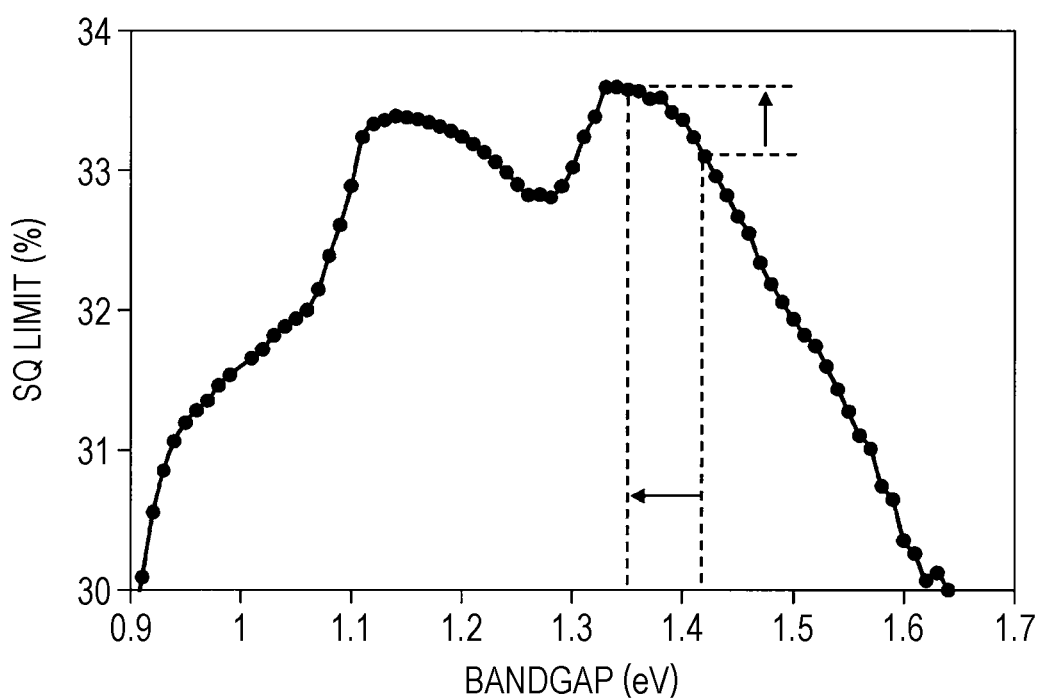
FIG. 1 is a graph of the theoretically calculated conversion efficiency of a unijunction solar cell as a function of the bandgap of a light-absorbing material.

It is known that the conversion efficiency of a solar cell depends on the bandgap of a light-absorbing material to be used. FIG. 1 shows the relationship between the bandgap of a light-absorbing material for the air mass 1.5 solar spectrum and the theoretically calculated conversion efficiency of a unijunction solar cell. FIG. 1 shows the bandgap around 1.4 eV. FIG. 1 shows that the conversion efficiency reaches the maximum value 33.6% at a bandgap of 1.34 eV around the bandgap of 1.4 eV. A similar calculation example is described in the literature E. Yablonovitch et al., "The influence of the 4n$^2$ Light Trapping Factor on Ultimate Solar Cell Efficiency", OSA Technical Digest (CD) (Optical Society of America, Washington, 2010), SWA1.

$FASnI_3$ is a perovskite compound with a perovskite crystal structure represented by the composition formula $AMX_3$ in which a formamidinium cation (FA$^+$) $CH(NH_2)_2^+$ is located at the A site, Sn$^{2+}$ is located at the M site, and I$^-$ is located at the X site. As described in Non-patent Literature 1, $FASnI_3$ has a bandgap of 1.41 eV, for example, which is smaller than the bandgap of a widely studied perovskite material $CH_3NH_3PbI_3$ (hereinafter sometimes abbreviated to "$MAPbI_3$"). The use of such a perovskite compound as a light-absorbing material for solar cells can further improve conversion efficiency.

On the basis of the first principle calculation results, Carlo Motta et al. reported in Nature Communications., 2015, 6, 7026 that a change in the bonding direction of MA$^+$ in $MAPbI_3$ converts $MAPbI_3$ from a direct transition semiconductor to an indirect transition semiconductor and decreases the bandgap of $MAPbI_3$. Motta et al. explains that a change in the hydrogen bond strength between the H atoms bonded to the N atom in MA$^+$ and I$^-$ alters the interaction strength between PbI$_6$ octahedrons, which is responsible for the decreased bandgap of $MAPbI_3$.

On the basis of the neutron diffraction results, Mark T. Weller et al. reported in Chem. Commun., 2015, 51, 4180-4183 that MA$^+$ in $MAPbI_3$ rotates at room temperature and tends to be oriented in a particular direction.

On the basis of the first principle calculation results, L. Leppert, et al. reported in J. Phys. Chem. Lett., 2016, 7, 3683-3689 that the orientation of $MA^+$ in $MAPbI_3$ in a single direction distorts the $PbI_6$ octahedron and increases the bandgap of $MAPbI_3$.

Thus, it has been suggested that the bandgap of $MAPbI_3$ changes with the bonding state of $MA^+$. However, there is no example of $FASnI_3$ that suggests a decrease in bandgap due to a change in the bonding state of $FA^+$.

In view of these considerations, as a result of repeated investigations, the present inventor has found a novel $FASnI_3$ perovskite compound with a smaller bandgap than before.

Summary of Aspect of Present Disclosure

A light-absorbing material according to a first aspect of the present disclosure contains a compound represented by the composition formula $HC(NH_2)_2SnI_3$ and having a perovskite structure. A solid-state $^1H$-NMR spectrum, which is obtained by $^1H$-$^{14}N$ HMQC measurement in two-dimensional nuclear magnetic resonance (NMR) at 25° C., of the compound includes a first peak at 6.9 ppm and a second peak at 7.0 ppm. A peak intensity of the first peak is equal to 80% or more of a peak intensity of the second peak.

The light-absorbing material according to the first aspect can absorb light in a wider wavelength range when organic molecules in the perovskite compound have a metastable bonding state. Thus, the light-absorbing material according to the first aspect can increase the conversion efficiency of a perovskite solar cell.

A light-absorbing material according to a second aspect of the present disclosure contains a compound represented by the composition formula $HC(NH_2)_2SnI_3$, having a perovskite structure, and having a spin-lattice relaxation time T1 in the range of 33 seconds or more and 45 seconds or less at 25° C. as measured by solid-state $^1H$-NMR spectroscopy.

The light-absorbing material according to the second aspect can stabilize the metastable bonding state of organic molecules in the perovskite compound and can absorb light in a wider wavelength range. Thus, the light-absorbing material according to the second aspect can increase the conversion efficiency of a perovskite solar cell.

A light-absorbing material according to a third aspect of the present disclosure contains a compound represented by the composition formula $HC(NH_2)_2SnI_3$ and having a perovskite structure. A fluorescence spectrum of the compound has a peak in the range of 1.33 eV or more and 1.39 eV or less.

In the light-absorbing material according to the third aspect, the perovskite compound has a fluorescence spectrum with a peak wavelength longer than peak wavelengths of known perovskite compounds. In other words, in the light-absorbing material according to the third aspect, the perovskite compound has a smaller bandgap than known perovskite compounds. Thus, the light-absorbing material according to the third aspect can increase the conversion efficiency of a perovskite solar cell.

In a fourth aspect, for example, in the light-absorbing material according to one of the first to third aspects, the compound contains crystals, and the crystals have the same orientation.

In the light-absorbing material according to the fourth aspect, the growth of the perovskite compound in the same crystalline orientation increases the crystal grain size of the perovskite compound and can thereby prevent carrier scattering and carrier recombination at grain boundaries. Thus, the light-absorbing material according to the fourth aspect can increase the conversion efficiency of a perovskite solar cell.

A solar cell according to a fifth aspect of the present disclosure includes a first electrode, a second electrode facing the first electrode, and a light-absorbing layer that is disposed between the first electrode and the second electrode and generates electric charges by photoelectric conversion. At least one electrode selected from the group consisting of the first electrode and the second electrode is light-transmissive. The light-absorbing layer contains the light-absorbing material according to at least one of the first to fourth aspects.

The solar cell according to the fifth aspect can have increased conversion efficiency due to the light-absorbing material according to at least one of the first to fourth aspects contained in the light-absorbing layer.

A solar cell according to a sixth aspect of the present disclosure includes a first electrode, a second electrode facing the first electrode, and a light-absorbing layer that is disposed between the first electrode and the second electrode and generates electric charges by photoelectric conversion. At least one electrode selected from the group consisting of the first electrode and the second electrode is light-transmissive. The light-absorbing layer includes a first layer containing a first compound, the first compound represented by a composition formula $AMX_3$ and having a perovskite structure, where A denotes a monovalent cation, M denotes a divalent cation, and X denotes a halogen anion, and a second layer disposed on the first layer and containing a second compound, the second compound represented by a composition formula $HC(NH_2)_2SnI_3$ and having a perovskite structure. The first compound and the second compound have different compositions.

The second layer of the light-absorbing layer in the solar cell according to the sixth aspect can absorb light in a wider wavelength range. Thus, the solar cell according to the sixth aspect can have increased conversion efficiency.

In a seventh aspect, for example, in the solar cell according to the sixth aspect, the first compound contains first crystals, the first crystals have the same orientation, the second compound contains second crystals, and the second crystals have the same orientation.

In the solar cell according to the seventh aspect, the growth of the perovskite compound in the same crystalline orientation increases the crystal grain size of the perovskite compound and can thereby prevent carrier scattering and carrier recombination at grain boundaries. Thus, the solar cell according to the seventh aspect can have increased conversion efficiency.

In an eighth aspect, for example, in the solar cell according to the seventh aspect, the orientation of the first crystals is the same as the orientation of the second crystals.

The solar cell according to the eighth aspect can have increased conversion efficiency.

A light-absorbing material according to a ninth aspect of the present disclosure contains a compound represented by the composition formula $HC(NH_2)_2SnI_3$, having a perovskite structure, and having a fluorescence spectrum with the maximum fluorescence intensity in the range of 1.31 to 1.36 eV being 27.7% or more of the maximum fluorescence intensity in the range of 1.40 to 1.46 eV.

In the light-absorbing material according to the ninth aspect, the perovskite compound has a fluorescence spectrum with a peak wavelength longer than peak wavelengths of known perovskite compounds. In other words, in the light-absorbing material according to the ninth aspect, the perovskite compound has a smaller bandgap than known perovskite compounds. Thus, the light-absorbing material according to the ninth aspect can increase the conversion efficiency of a perovskite solar cell.

A light-absorbing material according to a tenth aspect of the present disclosure contains a compound represented by the composition formula $HC(NH_2)_2SnI_3$, having a perovskite structure, and having a fluorescence spectrum with a peak at an energy of less than 1.40 eV.

In the light-absorbing material according to the tenth aspect, the perovskite compound has a fluorescence spectrum with a peak wavelength longer than peak wavelengths of known perovskite compounds. In other words, in the light-absorbing material according to the tenth aspect, the perovskite compound has a smaller bandgap than known perovskite compounds. Thus, the light-absorbing material according to the tenth aspect can increase the conversion efficiency of a perovskite solar cell.

Embodiments of Present Disclosure

Embodiments of the present disclosure will be described in detail below with reference to the accompanying drawings. These embodiments are only examples, and the present disclosure is not limited to these embodiments.

First Embodiment

A light-absorbing material according to a first embodiment of the present disclosure will be described below. The following is the outline of a light-absorbing material according to the present disclosure. Five embodiments (Embodiments A to E) of a light-absorbing material according to the present disclosure will be described below.

A light-absorbing material according to Embodiment A of the present disclosure contains a perovskite compound represented by the composition formula $HC(NH_2)_2SnI_3$, having a perovskite structure, and having the peak intensity at 6.9 ppm equal to 80% or more of the peak intensity at 7.0 ppm at 25° C. in a $^1H$-$^{14}N$ heteronuclear multiple quantum correlation (HMQC) solid-state $^1H$-NMR spectrum in two-dimensional NMR. Such a perovskite compound is hereinafter also referred to as a "perovskite compound of Embodiment A".

The perovskite compound of Embodiment A has a perovskite structure represented by $AMX_3$ in which $CH(NH_2)_2^+$ is located at the A site, $Sn^{2+}$ is located at the M site, and $I^-$ is located at the X site.

The light-absorbing material according to Embodiment A may mainly contain the perovskite compound of Embodiment A. The phrase "the light-absorbing material according to Embodiment A mainly contains the perovskite compound of Embodiment A", as used herein, means that the perovskite compound of Embodiment A constitutes 90% or more by mass, for example, 95% or more by mass, of the light-absorbing material, or the light-absorbing material may be composed entirely of the perovskite compound of Embodiment A.

The light-absorbing material according to Embodiment A may contain impurities as long as the light-absorbing material contains the perovskite compound of Embodiment A. The light-absorbing material according to Embodiment A may contain another compound other than the perovskite compound of Embodiment A.

$FASnI_3$ has a crystal structure that includes a FA cation as an organic molecule in a lattice formed by sharing the lattice points of a $SnI_6$ octahedron. The organic molecule has an energetically stable bonding direction (hereinafter referred to as a particular direction) and is bonded to the $SnI_6$ octahedron in the particular direction. The particular direction is not one direction and includes its symmetrical directions. The organic molecules are randomly oriented in these directions at room temperature. The bandgap of $FASnI_3$ can be controlled by stabilizing a bonding direction different from the particular direction, that is, a bonding state that is not energetically most stable (hereinafter referred to as a "metastable state") and thereby distorting the $SnI_6$ octahedron. In one exemplary metastable state, organic molecules are bonded in the same direction.

The perovskite compound of Embodiment A can stabilize the metastable state of the organic molecules, decrease the bandgap, and absorb light in a wide wavelength range. Thus, the perovskite compound of Embodiment A is useful as a light-absorbing material.

A material with such characteristics can absorb light in a wider wavelength range when the organic molecules are metastably bonded.

As described above, in the perovskite compound of Embodiment A, the peak intensity at 6.9 ppm at 25° C. in a $^1H$-$^{14}N$ HMQC solid-state $^1H$-NMR spectrum in two-dimensional NMR is 80% or more of the peak intensity at 7.0 ppm.

A light-absorbing material according to Embodiment B of the present disclosure contains a perovskite compound represented by the composition formula $HC(NH_2)_2SnI_3$, having a perovskite structure, and having a spin-lattice relaxation time T1 in the range of 33 to 45 seconds at 25° C. as measured by solid-state $^1H$-NMR spectroscopy. Such a perovskite compound is hereinafter also referred to as a "perovskite compound of Embodiment B".

Like the perovskite compound of Embodiment A, the perovskite compound of Embodiment B has a perovskite structure represented by $AMX_3$ in which $CH(NH_2)_2^+$ is located at the A site, $Sn^{2+}$ is located at the M site, and $I^-$ is located at the X site.

The light-absorbing material according to Embodiment B may mainly contain the perovskite compound of Embodiment B. The phrase "the light-absorbing material according to Embodiment B mainly contains the perovskite compound of Embodiment B", as used herein, means that the perovskite compound of Embodiment B constitutes 90% or more by mass, for example, 95% or more by mass, of the light-absorbing material, or the light-absorbing material may be composed entirely of the perovskite compound of Embodiment B.

The light-absorbing material according to Embodiment B may contain impurities as long as the light-absorbing material contains the perovskite compound of Embodiment B. The light-absorbing material according to Embodiment B may contain another compound other than the perovskite compound of Embodiment B.

As described above, the perovskite compound of Embodiment B has a spin-lattice relaxation time T1 in the range of 33 to 45 seconds, which is longer than that of known $FASnI_3$. The spin-lattice relaxation time corresponds to confining force in the compound and to activation energy for returning the bonding state of the compound to the most stable bonding state. More specifically, a longer spin-lattice relaxation time indicates more stable bonding in the compound. In general, an energetically unstable bonding state makes a transition to the most stable state. However, a stabilized bonding state has higher activation energy for transition and allows the metastable state to be maintained.

Having such characteristics, the perovskite compound of Embodiment B can stabilize the metastable bonding state of organic molecules and can absorb light in a wider wavelength range.

A light-absorbing material according to Embodiment C of the present disclosure contains a perovskite compound represented by the composition formula $HC(NH_2)_2SnI_3$, having a perovskite structure, and having a fluorescence spectrum with a peak in the range of 1.33 to 1.39 eV. Such a perovskite compound is hereinafter also referred to as a "perovskite compound of Embodiment C".

Like the perovskite compound of Embodiment A, the perovskite compound of Embodiment C has a perovskite structure represented by $AMX_3$ in which $CH(NH_2)_2^+$ is located at the A site, $Sn^{2+}$ is located at the M site, and $I^-$ is located at the X site.

The light-absorbing material according to Embodiment C may mainly contain the perovskite compound of Embodiment C. The phrase "the light-absorbing material according to Embodiment C mainly contains the perovskite compound of Embodiment C", as used herein, means that the perovskite compound of Embodiment C constitutes 90% or more by mass, for example, 95% or more by mass, of the light-absorbing material, or the light-absorbing material may be composed entirely of the perovskite compound of Embodiment C.

The light-absorbing material according to Embodiment C may contain impurities as long as the light-absorbing material contains the perovskite compound of Embodiment C. The light-absorbing material according to Embodiment C may contain another compound other than the perovskite compound of Embodiment C.

As described above, the perovskite compound of Embodiment C has a fluorescence spectrum with a peak in the range of 1.33 to 1.39 eV. This peak is defined as a first peak. For example, the first peak is located at 1.35 eV. The perovskite compound of Embodiment C may have a fluorescence spectrum with a second peak located at a shorter wavelength than the first peak. For example, the second peak is located at 1.42 eV. The phrase "the perovskite compound has a fluorescence spectrum with a peak in the range of 1.33 to 1.39 eV", as used herein, means that the spectral intensity at 1.35 eV in the fluorescence spectrum is 70% or more of the spectral intensity at 1.42 eV, for example. A fluorescence spectrum of a perovskite compound can be measured with a commercially available fluorescence spectrophotometer.

Light-absorbing materials according to Embodiments D and E of the present disclosure contain a perovskite compound represented by the composition formula $HC(NH_2)_2SnI_3$ and having a perovskite structure. In the light-absorbing materials according to Embodiments D and E, the crystals of the perovskite compound have the same orientation. The crystals of the perovskite compound have the (100) or (110) orientation, for example. As described later, the light-absorbing materials according to Embodiments D and E are produced by different methods. The light-absorbing material according to Embodiment D may be the same as the light-absorbing material according to Embodiment E. Such a perovskite compound is hereinafter also referred to as "a perovskite compound of Embodiment D", "a perovskite compound of Embodiment E", or "perovskite compounds of Embodiments D and E".

Like the perovskite compound of Embodiment A, the perovskite compounds of Embodiments D and E have a perovskite structure represented by $AMX_3$ in which $CH(NH_2)_2^+$ is located at the A site, $Sn^{2+}$ is located at the M site, and $I^-$ is located at the X site.

The light-absorbing material according to Embodiment D may mainly contain the perovskite compound of Embodiment D. The phrase "the light-absorbing material according to Embodiment D mainly contains the perovskite compound of Embodiment D", as used herein, means that the perovskite compound of Embodiment D constitutes 70% or more by mass, for example, 95% or more by mass, of the light-absorbing material, or the light-absorbing material may be composed entirely of the perovskite compound of Embodiment D.

The light-absorbing material according to Embodiment D may contain impurities as long as the light-absorbing material contains the perovskite compound of Embodiment D. The light-absorbing material according to Embodiment D may contain another compound other than the perovskite compound of Embodiment D.

The light-absorbing material according to Embodiment E may mainly contain the perovskite compound of Embodiment E. The phrase "the light-absorbing material according to Embodiment E mainly contains the perovskite compound of Embodiment E", as used herein, means that the perovskite compound of Embodiment E constitutes 90% or more by mass, for example, 95% or more by mass, of the light-absorbing material, or the light-absorbing material may be composed entirely of the perovskite compound of Embodiment E.

The light-absorbing material according to Embodiment E may contain impurities as long as the light-absorbing material contains the perovskite compound of Embodiment E. The light-absorbing material according to Embodiment E may contain another compound other than the perovskite compound of Embodiment E.

As described above, the crystals of the perovskite compounds of Embodiments D and E have the same orientation. Thus, the light-absorbing materials according to Embodiments D and E have a single orientation. The phrase "have a single orientation", as used herein, means that the crystals of a perovskite compound in a light-absorbing material have almost the same orientation, or the crystals of a perovskite compound in a light-absorbing material preferentially have a certain orientation. The phrase "have a single orientation" includes the state in which the crystals of a perovskite compound in a light-absorbing material have exactly the same orientation. In the present specification, for example, when the (100) plane of the crystals of a perovskite compound in a light-absorbing material is parallel to a particular surface of the light-absorbing material, such crystal growth is described as "the crystals of the perovskite compound have a single orientation in the (100) direction" or simply as "the crystals of the perovskite compound have the (100) orientation".

The light-absorbing materials according to Embodiments D and E may be the light-absorbing material according to any one of Embodiments A to C in which the crystals of the perovskite compound have the same orientation. The crystals of the perovskite compounds of Embodiments D and E have the (100) or (110) orientation, for example. The orientation of crystals of a perovskite compound can be determined by X-ray diffractometry (XRD). A perovskite compound having a single crystalline orientation has strong peaks only at a particular angle and at a constant multiple of the particular angle in XRD measurements. For example, for a perovskite compound $FASnI_3$, the crystals of the perovskite compound with peaks only at angles 2θ of approximately 14, 28, and 43 degrees in XRD measurements have a single orientation in the (100) direction. The crystals of the perovskite compound with peaks only at angles 2θ of approximately 20 and 40 degrees in XRD measurements have a single orientation in the (110) direction.

In known $FASnI_3$, which contains crystals with various orientations, crystal grains may grow slowly due to collisions of crystal growth faces. In such a case, the volume of grain boundaries increases. Grain boundaries scatter carriers in the crystals and reduce carrier mobility. Grain boundaries have defect levels. Defect levels mediate the recombination of carriers. Some photoexcited carriers disappear by recombination, which decreases the number of carriers. Thus, an increased volume of grain boundaries may result in a decrease in short-circuit current density, which is a property of solar cells. By contrast, in the light-absorbing materials according to Embodiments D and E, crystals grow in the same orientation, and the crystal grains in the light-absorbing material grow significantly, thereby decreasing the volume of grain boundaries. Thus, the perovskite compounds of Embodiments D and E having such characteristics can prevent carrier scattering and carrier recombination at grain boundaries.

The basic operational advantages of the light-absorbing materials according to Embodiments A to E will be described below.

Physical Properties of Perovskite Compounds

The perovskite compounds of Embodiments A to E can have the following physical properties useful for light-absorbing materials for solar cells.

The theoretically maximum conversion efficiency is achieved at 1.34 eV. The perovskite compounds of Embodiments A to E can have a bandgap closer to 1.34 eV than that of known $FASnI_3$ (bandgap: 1.41 eV). For example, the perovskite compounds of Embodiments A to E have a bandgap in the range of 1.33 to 1.39 eV at 25° C.

The bandgap of a perovskite compound can be calculated from the peak wavelength of an emission spectrum obtained in photoluminescence measurements of the perovskite compound or from the absorption edge wavelength obtained in absorbance measurements of the perovskite compound.

The following is a possible reason why the perovskite compounds of Embodiments A to E have long-wavelength absorption resulting from a smaller bandgap than before.

As described in literature, a FA cation in a known $FASnI_3$ perovskite compound is bonded in an energetically stable particular direction. NMR measurements and other results suggest that the perovskite compounds of Embodiments A to E contain a FA cation bonded in a metastable direction different from the stable bonding direction. The presence of such a FA cation bonded in a metastable direction distorts the $SnI_6$ octahedron and decreases the bandgap to approximately 1.35 eV. Thus, such light-absorbing materials for solar cells can have high efficiency.

Method for Producing Light-Absorbing Material

A method for producing each of the perovskite compounds of Embodiments A to E will be described below. Although the inverse temperature crystallization (ITC) method is described below, a method for producing each of the perovskite compounds of Embodiments A to E is not limited to this method.

A method for producing each of the perovskite compounds of Embodiments A to C will be described below.

First, the same number of moles of $SnI_2$ and formamidinium iodide (FAI) $HC(NH_2)_2I$ are added to an organic solvent. The molar concentration of each of $SnI_2$ and FAI may range from 0.8 to 2.0 mol/L or 0.8 to 1.0 mol/L. The organic solvent is γ-valerolactone (GVL), for example.

$SnI_2$ and FAI in GVL are then heated with a heater, such as an oil bath or a hot plate, to a temperature in the range of 40° C. to 120° C. to dissolve $SnI_2$ and FAI in GVL, thus producing a first solution. The first solution is then left at room temperature.

The first solution is then applied to a substrate, such as a glass substrate, by spin coating and is heated to a temperature in the range of 100° C. to 180° C. to form a sample that includes a $FASnI_3$ template layer on the glass substrate.

After the first solution and the sample are heated to a temperature in the range of 100° C. to 180° C., the high-temperature sample is dipped in the high-temperature first solution.

The sample is removed from the first solution, and the solvent is removed from the surface of the sample, for example, with a blower. The sample is then heat-treated, for example, at 100° C. for 5 to 15 minutes, and is subsequently heat-treated, for example, at 180° C. for 5 to 15 minutes. This step can volatilize almost all the residual solvent and can prevent the formation of an impurity phase in the sample. The perovskite compounds $FASnI_3$ of Embodiments A to C thus produced can have characteristics different from the characteristics of the template layer.

A method for producing the perovskite compound of Embodiment D is described below.

First, $PbI_2$ and methyl ammonium iodide (MAI) $CH_3NH_3I$ are added to an organic solvent. The organic solvent is dimethyl sulfoxide (DMSO), for example.

$PbI_2$ and MAI in DMSO are then heated with the heater to a temperature in the range of 40° C. to 120° C. to dissolve $PbI_2$ and MAI, thus producing a second solution. The second solution is then left at room temperature.

The second solution is then applied to a glass substrate by spin coating and is heated to a temperature in the range of 100° C. to 180° C. to form a $MAPbI_3$ template layer on the glass substrate. For example, when the concentration of each of $PbI_2$ and MAI in the second solution is 1 mol/L, and the template layer is formed at 130° C. for 10 minutes, a sample thus produced includes a $MAPbI_3$ template layer with the (110) orientation formed on the glass substrate. When the concentration of $PbI_2$ in the second solution is 1 mol/L, the concentration of MAI in the second solution is 3 mol/L, and the template layer is formed at 170° C. for 5 minutes, a sample thus produced includes a $MAPbI_3$ template layer with the (100) orientation on the glass substrate.

$FASnI_3$ crystals are then grown on the template layer by the method for producing $FASnI_3$ of Embodiments A to C. Thus, the sample is dipped in the first solution. The sample is removed from the first solution and is heat-treated. $FASnI_3$ crystals may be grown on the template layer under the conditions for the method for producing the perovskite compounds of Embodiments A to C. $FASnI_3$ of Embodiment D thus produced can have characteristics different from the characteristics of the template layer and reflect the crystalline orientation of the template layer. $FASnI_3$ of Embodiment D may contain a constituent element (MA or Pb) of the template layer as an impurity.

A method for producing the perovskite compound of Embodiment E is described below.

First, $SnI_2$ and MAI are added to an organic solvent. The organic solvent is a mixed solution of DMSO:N,N-dimethylformamide (DMF)=1:1, for example.

$SnI_2$ and MAI in the mixed solution are then heated with the heater to a temperature in the range of 40° C. to 120° C. to dissolve $SnI_2$ and MAI, thus producing a third solution. The third solution is then left at room temperature.

The third solution is applied to a glass substrate by spin coating and is heated to a temperature in the range of 100° C. to 180° C. to form a $MASnI_3$ template layer on the glass substrate. At this time, 200 μL of chlorobenzene may be dropped on the rotating substrate. For example, when the concentration of each of $SnI_2$ and MAI in the third solution is 1 mol/L, and the template layer is formed at 100° C. for 10 minutes and then at 180° C. for 15 minutes, a sample thus produced includes a $MASnI_3$ template layer with the (100) orientation on the glass substrate.

$FASnI_3$ crystals are then grown on the template layer by the method for producing $FASnI_3$ of Embodiments A to C. Thus, the sample is dipped in the first solution. The sample is removed from the first solution and is heat-treated. $FASnI_3$ crystals may be grown on the template layer under the conditions for the method for producing the perovskite compounds of Embodiments A to C. $FASnI_3$ of Embodiment E thus produced can have characteristics different from the characteristics of the template layer and reflect the crystalline orientation of the template layer.

The first to third solutions may contain 0.05 to 0.4 mol/L of a quencher substance, such as tin fluoride. The quencher substance can reduce defects, for example, the increase in the number of $Sn^{4+}$ relative to $Sn^{2+}$, in the sample.

Second Embodiment

A perovskite solar cell according to a second embodiment of the present disclosure will be described below.

The solar cell according to the present embodiment includes a first electrode, a second electrode, and a light-absorbing layer disposed between the first electrode and the second electrode. The first electrode faces the second electrode with the light-absorbing layer interposed therebetween. At least one electrode selected from the group consisting of the first electrode and the second electrode can transmit light. The phrase "an electrode can transmit light", as used herein, means that the electrode can transmit 10% or more of light with a wavelength in the range of 200 to 2000 nm. The light-absorbing layer contains at least one of the light-absorbing materials according to Embodiments A to E of the first embodiment. The solar cell according to the present embodiment can have increased conversion efficiency due to at least one of the light-absorbing materials according to Embodiments A to E of the first embodiment. The structure of the solar cell according to the present embodiment and a method for producing the solar cell will be described below. Seven structural examples (first to seventh examples) of the solar cell and methods for producing them will be described below with reference to the accompanying drawings.

Figure 2:
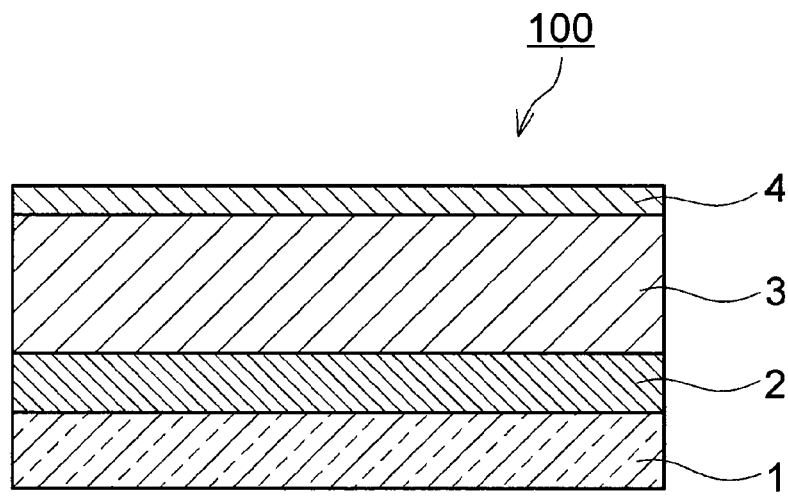
FIG. 2 is a schematic cross-sectional view of a solar cell according to a first example of the present disclosure.

FIG. 2 is a schematic cross-sectional view of a solar cell 100 according to the first example of the present embodiment.

The solar cell 100 includes a first electrode 2, a light-absorbing layer 3, and a second electrode 4 in this order on a substrate 1. A light-absorbing material of the light-absorbing layer 3 contains the perovskite compound according to the first embodiment. The substrate 1 may be omitted in the solar cell 100.

Some basic operational advantages of the solar cell 100 will be described below. Upon irradiation of the solar cell 100 with light, the light-absorbing layer 3 absorbs light and generates excited electrons and positive holes. The excited electrons are transferred to the first electrode 2. The positive holes in the light-absorbing layer 3 are transferred to the second electrode 4. Thus, the solar cell 100 can generate an electric current from the first electrode 2 serving as a negative electrode and the second electrode 4 serving as a positive electrode.

The solar cell 100 can be produced by the following method, for example. First, the first electrode 2 is formed on the substrate 1 by a chemical vapor deposition method or a sputtering method, for example. The light-absorbing layer 3 is then formed on the first electrode 2. For example, the perovskite compound $FASnI_3$ produced by the method described above may be formed into the light-absorbing layer 3 with a predetermined thickness on the first electrode 2. The second electrode 4 is then formed on the light-absorbing layer 3 to produce the solar cell 100.

The components of the solar cell 100 will be further described below.

Substrate 1

The substrate 1 is an optional component. The substrate 1 supports the layers of the solar cell 100. The substrate 1 can be formed of a transparent material. For example, the substrate 1 may be a glass substrate or a plastic substrate. The plastic substrate may be a plastic film. If the first electrode 2 has sufficient strength, the first electrode 2 can support the layers without the substrate 1.

First Electrode 2

The first electrode 2 is electrically conductive. The first electrode 2 does not form an ohmic contact with the light-absorbing layer 3. The first electrode 2 blocks the transfer of positive holes from the light-absorbing layer 3. Blocking the transfer of positive holes from the light-absorbing layer 3 means that only electrons generated in the light-absorbing layer 3 can pass through, whereas the positive holes cannot pass through. A material with such characteristics has a Fermi energy higher than the energy of the highest valence band of the light-absorbing layer 3. The material may also be a material with a Fermi energy higher than the Fermi energy of the light-absorbing layer 3. More specifically, aluminum may be used.

The first electrode 2 can transmit light. For example, the first electrode 2 can transmit light in the visible to near-infrared region. For example, the first electrode 2 can be formed of a transparent electrically conductive metal oxide and/or metal nitride. Examples of such materials include titanium oxides doped with at least one of lithium, magnesium, niobium, and fluorine, gallium oxides doped with at least one of tin and silicon, gallium nitrides doped with at least one of silicon and oxygen, indium-tin composite oxides, tin oxides doped with at least one of antimony and fluorine, zinc oxides doped with at least one of boron, aluminum, gallium, and indium, and composites thereof.

The first electrode 2 may be formed of an opaque material by forming a light-transmitting pattern. The light-transmitting pattern may be a linear pattern, a wavy line pattern, a grid-like pattern, a punching metal pattern with many regularly or irregularly arranged fine through-holes, or a reverse pattern thereof. In the first electrode 2 with any of these patterns, light can pass through a portion not filled with the electrode material. Examples of the opaque electrode material include platinum, gold, silver, copper, aluminum, rhodium, indium, titanium, iron, nickel, tin, zinc, and alloys thereof. An electrically conductive carbon material may also be used.

The first electrode 2 may have a light transmittance of 50% or more or 80% or more. The wavelength of light to be transmitted depends on the absorption wavelength of the light-absorbing layer 3. The first electrode 2 may have a thickness in the range of 1 to 1000 nm.

Light-Absorbing Layer 3

The light-absorbing layer 3 contains at least one of the light-absorbing materials according to Embodiments A to E of the first embodiment. More specifically, the light-absorbing material of the light-absorbing layer 3 contains at least one of the perovskite compounds according to Embodiments A to E of the first embodiment. The thickness of the light-absorbing layer 3 depends on the degree of light absorption and ranges from 100 nm to 10 µm, for example. The light-absorbing layer 3 may be formed of a perovskite compound $FASnI_3$, as described above. The light-absorbing layer 3 may include a $FASnI_3$ template layer and a perovskite compound $FASnI_3$ formed on the template layer.

Second Electrode 4

The second electrode 4 is electrically conductive. The second electrode 4 does not form an ohmic contact with the light-absorbing layer 3. The second electrode 4 blocks the transfer of electrons from the light-absorbing layer 3. Blocking the transfer of electrons from the light-absorbing layer 3 means that only positive holes generated in the light-absorbing layer 3 can pass through, whereas the electrons cannot pass through. A material with such characteristics has a Fermi energy lower than the energy of the lowest conduction band of the light-absorbing layer 3. The material may also be a material with a Fermi energy lower than the Fermi energy of the light-absorbing layer 3. More specifically, platinum, gold, and carbon materials, such as graphene, may be used.

Figure 3:
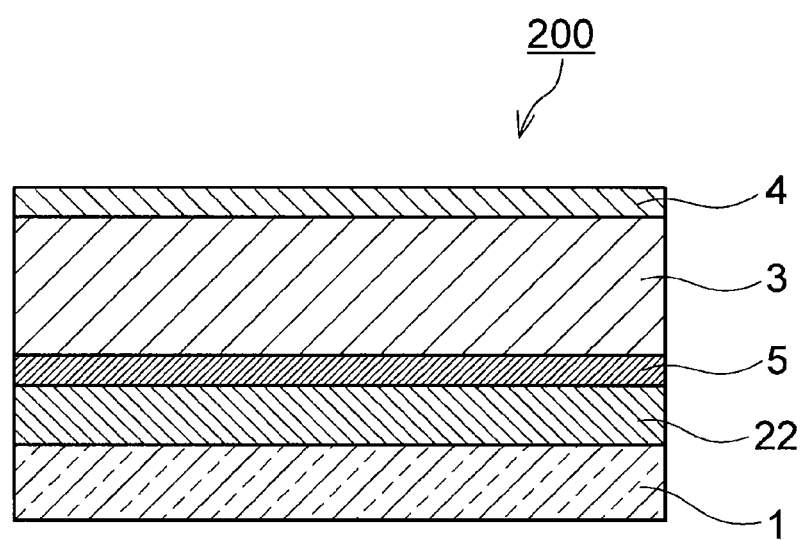
FIG. 3 is a schematic cross-sectional view of a solar cell according to a second example of the present disclosure.

FIG. 3 is a schematic cross-sectional view of a solar cell 200 according to the second example of the present embodiment. Unlike the solar cell 100 illustrated in FIG. 2, the solar cell 200 includes an electron-transport layer 5. Components with the same function and structure as the solar cell 100 are denoted by the same reference numerals and will not be further described.

The solar cell 200 includes a first electrode 22, an electron-transport layer 5, a light-absorbing layer 3, and a second electrode 4 in this order on a substrate 1. The substrate 1 may be omitted in the solar cell 200.

Some basic operational advantages of the solar cell 200 will be described below. Upon irradiation of the solar cell 200 with light, the light-absorbing layer 3 absorbs light and generates excited electrons and positive holes. The excited electrons are transferred to the first electrode 22 through the electron-transport layer 5. The positive holes in the light-absorbing layer 3 are transferred to the second electrode 4. Thus, the solar cell 200 can generate an electric current from the first electrode 22 serving as a negative electrode and the second electrode 4 serving as a positive electrode.

The solar cell 200 includes the electron-transport layer 5. Thus, the first electrode 22 does not need to block the positive holes from the light-absorbing layer 3. This increases the choice of the material for the first electrode 22.

The solar cell 200 can be produced in the same manner as the solar cell 100 illustrated in FIG. 2. The electron-transport layer 5 can be formed on the first electrode 22 by a sputtering method.

The components of the solar cell 200 will be further described below.

First Electrode 22

The first electrode 22 is electrically conductive. The first electrode 22 may have the same structure as the first electrode 2. In the solar cell 200, due to the electron-transport layer 5, the first electrode 22 does not need to block positive holes from the light-absorbing layer 3. Thus, the material of the first electrode 22 may form an ohmic contact with the light-absorbing layer 3.

The first electrode 22 can transmit light. For example, the first electrode 22 can transmit light in the visible to near-infrared region. The first electrode 22 can be formed of a transparent electrically conductive metal oxide and/or metal nitride. Examples of such materials include titanium oxides doped with at least one of lithium, magnesium, niobium, and fluorine, gallium oxides doped with at least one of tin and silicon, gallium nitrides doped with at least one of silicon and oxygen, indium-tin composite oxides, tin oxides doped with at least one of antimony and fluorine, zinc oxides doped with at least one of boron, aluminum, gallium, and indium, and composites thereof.

The material for the first electrode 22 may be an opaque material. In this case, in the same manner as the first electrode 2, the first electrode 22 has a light-transmitting pattern. Examples of the opaque electrode material include platinum, gold, silver, copper, aluminum, rhodium, indium, titanium, iron, nickel, tin, zinc, and alloys thereof. An electrically conductive carbon material may also be used.

The first electrode 22 may have a light transmittance of 50% or more or 80% or more. The wavelength of light to be transmitted depends on the absorption wavelength of the light-absorbing layer 3. The first electrode 22 may have a thickness in the range of 1 to 1000 nm.

Electron-Transport Layer 5

The electron-transport layer 5 contains a semiconductor. The electron-transport layer 5 may be a semiconductor with a bandgap of 3.0 eV or more. The electron-transport layer 5 formed of a semiconductor with a bandgap of 3.0 eV or more can transmit visible light and infrared light to the light-absorbing layer 3. The semiconductor may be an organic or inorganic n-type semiconductor.

Examples of the organic n-type semiconductor include imide compounds, quinone compounds, and fullerenes and their derivatives. Examples of the inorganic n-type semiconductor include oxides of metal elements, nitrides of metal elements, and perovskite oxides. Examples of the oxides of metal elements include oxides of Cd, Zn, In, Pb, Mo, W, Sb, Bi, Cu, Hg, Ti, Ag, Mn, Fe, V, Sn, Zr, Sr, Ga, Si, and Cr. More specifically, $TiO_2$ may be used. Examples of the nitrides of metal elements include GaN. Examples of the perovskite oxides include $SrTiO_3$ and $CaTiO_3$.

The electron-transport layer 5 may be formed of a substance with a bandgap of more than 6.0 eV. The substance with a bandgap of more than 6.0 eV may be an alkali metal or alkaline-earth metal halide, such as lithium fluoride or calcium fluoride, an alkali metal oxide, such as magnesium oxide, or silicon dioxide. In this case, in order to ensure the electron-transport ability of the electron-transport layer 5, the electron-transport layer 5 has a thickness of 10 nm or less, for example.

The electron-transport layer 5 may include layers of different materials.

Figure 4:
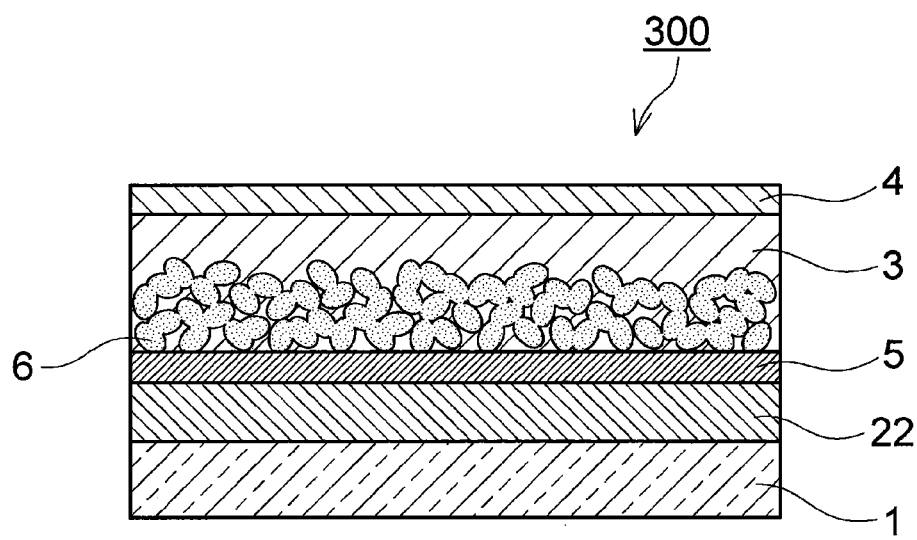
FIG. 4 is a schematic cross-sectional view of a solar cell according to a third example of the present disclosure.

FIG. 4 is a schematic cross-sectional view of a solar cell 300 according to the third example of the present embodiment. Unlike the solar cell 200 illustrated in FIG. 3, the solar cell 300 includes a porous layer 6. Components with the same function and structure as the solar cell 200 are denoted by the same reference numerals and will not be further described.

The solar cell 300 includes a first electrode 22, an electron-transport layer 5, a porous layer 6, a light-absorbing layer 3, and a second electrode 4 in this order on a substrate 1. The porous layer 6 includes a porous body. The porous body includes pores. The substrate 1 may be omitted in the solar cell 300.

The pores in the porous layer 6 communicate with the light-absorbing layer 3 and the electron-transport layer 5. Thus, the material of the light-absorbing layer 3 can fill the pores of the porous layer 6 and reach the electron-transport layer 5. Thus, the light-absorbing layer 3 is in contact with the electron-transport layer 5, and electrons can be directly transferred between the light-absorbing layer 3 and the electron-transport layer 5.

Some basic operational advantages of the solar cell 300 will be described below. Upon irradiation of the solar cell 300 with light, the light-absorbing layer 3 absorbs light and generates excited electrons and positive holes. The excited electrons are transferred to the first electrode 22 through the electron-transport layer 5. The positive holes in the light-absorbing layer 3 are transferred to the second electrode 4. Thus, the solar cell 300 can generate an electric current from the first electrode 22 serving as a negative electrode and the second electrode 4 serving as a positive electrode.

The porous layer 6 on the electron-transport layer 5 facilitates the formation of the light-absorbing layer 3. More specifically, the material of the light-absorbing layer 3 enters the pores of the porous layer 6, and the porous layer 6 serves as a scaffold of the light-absorbing layer 3. Thus, the material of the light-absorbing layer 3 is rarely repelled by the porous layer 6 or rarely aggregates. Thus, the light-absorbing layer 3 can be uniformly formed. For example, the light-absorbing layer 3 in the solar cell 300 can be formed by forming a $FASnI_3$ template layer on the porous layer 6 of a layered body composed of the substrate 1, the first electrode 22, the electron-transport layer 5, and the porous layer 6 and by dipping the layered body in a heated solution to grow the crystals. The solution used in this method may be the first solution described in the first embodiment. The template layer may be formed by the method described in the first embodiment.

The porous layer 6 is expected to scatter light and thereby increase the optical path length of light passing through the light-absorbing layer 3. The numbers of electrons and positive holes generated in the light-absorbing layer 3 will increase with the optical path length.

The solar cell 300 can be produced in the same manner as the solar cell 200. The porous layer 6 is formed on the electron-transport layer 5, for example, by a coating method.
Porous Layer 6

The porous layer 6 serves as a base for the light-absorbing layer 3. The porous layer 6 does not block light absorption in the light-absorbing layer 3 or electron transfer from the light-absorbing layer 3 to the electron-transport layer 5.

The porous layer 6 includes a porous body. The porous body may be composed of insulating or semiconductor particles. The insulating particles may be aluminum oxide or silicon oxide particles. The semiconductor particles may be inorganic semiconductor particles. Examples of the inorganic semiconductor include oxides of metal elements, perovskite oxides of metal elements, sulfides of metal elements, and metal chalcogenides. Examples of the oxides of metal elements include oxides of Cd, Zn, In, Pb, Mo, W, Sb, Bi, Cu, Hg, Ti, Ag, Mn, Fe, V, Sn, Zr, Sr, Ga, Si, and Cr. More specifically, $TiO_2$ may be used. Examples of the perovskite oxides of metal elements include $SrTiO_3$ and $CaTiO_3$. Examples of the sulfides of metal elements include CdS, ZnS, $In_2S_3$, PbS, $Mo_2S$, $WS_2$, $Sb_2S_3$, $Bi_2S_3$, $ZnCdS_2$, and $Cu_2S$. Examples of the metal chalcogenides include CsSe, $In_2Se_3$, $WSe_2$, HgS, PbSe, and CdTe.

The porous layer 6 may have a thickness in the range of 0.01 to 10 µm or 0.1 to 1 µm. The porous layer 6 may have a rough surface. More specifically, the surface roughness factor given by the effective area/projected area ratio may be 10 or more or 100 or more. The projected area refers to the area of a shadow of an object illuminated with light from the front. The effective area refers to the actual surface area of the object. The effective area can be calculated from the volume determined from the projected area and thickness of the object and the specific surface area and bulk density of the material of the object. The specific surface area is measured by a nitrogen adsorption method, for example.

Figure 5:
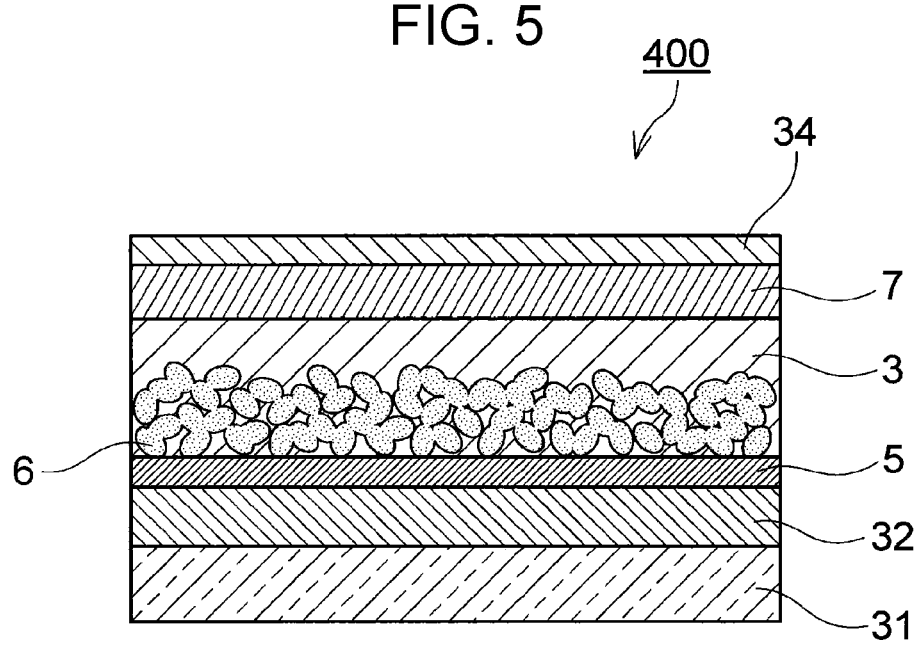
FIG. 5 is a schematic cross-sectional view of a solar cell according to a fourth example of the present disclosure.

FIG. 5 is a schematic cross-sectional view of a solar cell 400 according to the fourth example of the present embodiment. Unlike the solar cell 300 illustrated in FIG. 4, the solar cell 400 includes a hole-transport layer 7. Components with the same function and structure as the solar cell 300 are denoted by the same reference numerals and will not be further described.

The solar cell 400 includes a first electrode 32, an electron-transport layer 5, a porous layer 6, a light-absorbing layer 3, a hole-transport layer 7, and a second electrode 34 in this order on a substrate 31. The substrate 31 may be omitted in the solar cell 400.

Some basic operational advantages of the solar cell 400 according to the present embodiment will be described below.

Upon irradiation of the solar cell 400 with light, the light-absorbing layer 3 absorbs light and generates excited electrons and positive holes. The excited electrons are transferred to the electron-transport layer 5. The positive holes in the light-absorbing layer 3 are transferred to the hole-transport layer 7. The electron-transport layer 5 is connected to the first electrode 32, and the hole-transport layer 7 is connected to the second electrode 34. Thus, the solar cell 400 can generate an electric current from the first electrode 32 serving as a negative electrode and the second electrode 34 serving as a positive electrode.

The solar cell 400 includes the hole-transport layer 7 between the light-absorbing layer 3 and the second electrode 34. Thus, the second electrode 34 does not need to block electrons from the light-absorbing layer 3. This increases the choice of the material for the second electrode 34.

The components of the solar cell 400 will be further described below. The components described for the solar cell 300 will not be described here.
First Electrode 32 and Second Electrode 34

As described above, the second electrode 34 does not need to block electrons from the light-absorbing layer 3. Thus, the material of the second electrode 34 may form an ohmic contact with the light-absorbing layer 3. Thus, the second electrode 34 can be formed to transmit light.

At least one of the first electrode 32 and the second electrode 34 can transmit light and has the same structure as the first electrode 2 of the solar cell 100.

One of the first electrode 32 and the second electrode 34 does not need to transmit light. Thus, a light-transmitting material or a pattern with an opening portion for transmitting light is not necessarily required.
Substrate 31

The substrate 31 may be the same as the substrate 1 of the solar cell 100 illustrated in FIG. 2. If the second electrode 34 can transmit light, the material for the substrate 31 may be opaque. For example, the material for the substrate 31 may be a metal, a ceramic, or a resin material with low optical transparency.
Hole-Transport Layer 7

The hole-transport layer 7 is composed of an organic substance, an inorganic semiconductor, etc. The hole-transport layer 7 may include layers of different materials.

The hole-transport layer 7 may have a thickness in the range of 1 to 1000 nm or 10 to 50 nm. This range results in satisfactory hole-transport characteristics. Furthermore, due to low resistance, highly efficient photovoltaic power generation is possible.

The hole-transport layer 7 can be formed by a coating method or a printing method. Examples of the coating method include a doctor blade method, a bar coating method, a spray method, a dip coating method, and a spin coating method. The printing method may be a screen printing method. If necessary, materials may be mixed to form the hole-transport layer 7 and may be pressed or baked. When the material for the hole-transport layer 7 is a low-molecular-weight organic material or an inorganic semiconductor, the hole-transport layer 7 can be formed by a vacuum deposition method.

The hole-transport layer 7 may contain a supporting electrolyte and a solvent. The supporting electrolyte and solvent can stabilize positive holes in the hole-transport layer 7.

Examples of the supporting electrolyte include ammonium salts and alkali metal salts. Examples of the ammonium salts include tetrabutylammonium perchlorate, tetraethylammonium hexafluorophosphate, imidazolium salts, and pyridinium salts. Examples of the alkali metal salts include lithium perchlorate and potassium tetrafluoroborate.

The solvent in the hole-transport layer 7 may have high ionic conductivity. The solvent may be an aqueous solvent or an organic solvent. An organic solvent may be used to further stabilize a solute. Specific examples include heterocyclic compound solvents, such as tert-butylpyridine, pyridine, and n-methylpyrrolidone.

The solvent may be an ionic liquid alone or a mixture of an ionic liquid and another solvent. An ionic liquid advantageously has low volatility and high flame retardancy.

Examples of the ionic liquid include imidazoliums, such as 1-ethyl-3-methylimidazolium tetracyanoborate, pyridines, alicyclic amines, aliphatic amines, and azonium amines.

Figure 6:
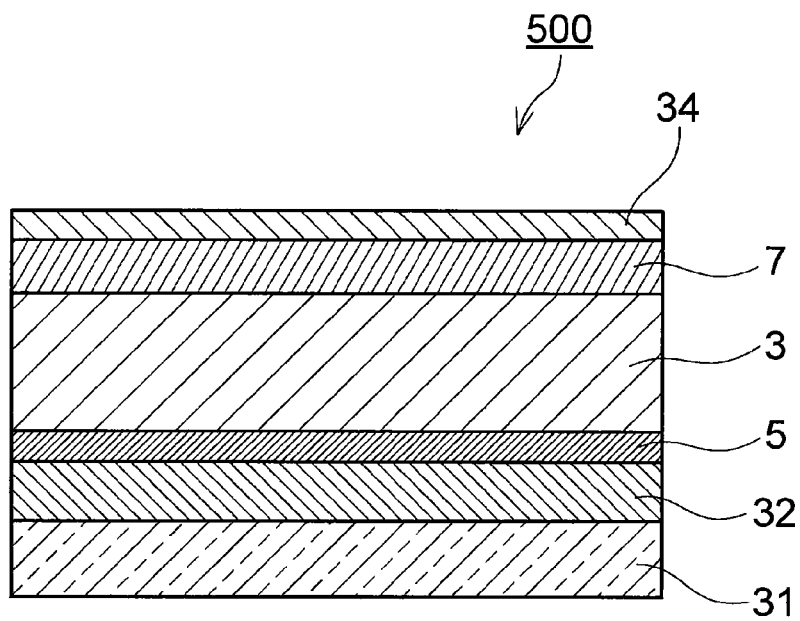
FIG. 6 is a schematic cross-sectional view of a solar cell according to a fifth example of the present disclosure.

FIG. 6 is a schematic cross-sectional view of a solar cell 500 according to the fifth example of the present embodiment. Unlike the solar cell 400 illustrated in FIG. 5, the solar cell 500 does not include the porous layer 6. Components with the same function and structure as the solar cell 400 are denoted by the same reference numerals and will not be further described.

The solar cell 500 includes the first electrode 32, the electron-transport layer 5, the light-absorbing layer 3, the hole-transport layer 7, and the second electrode 34 in this order on the substrate 31. The substrate 31 may be omitted in the solar cell 500.

Some basic operational advantages of the solar cell 500 according to the present embodiment will be described below.

Upon irradiation of the solar cell 500 with light, the light-absorbing layer 3 absorbs light and generates excited electrons and positive holes. The excited electrons are transferred to the electron-transport layer 5. The positive holes in the light-absorbing layer 3 are transferred to the hole-transport layer 7. The electron-transport layer 5 is connected to the first electrode 32, and the hole-transport layer 7 is connected to the second electrode 34. Thus, the solar cell 500 can generate an electric current from the first electrode 32 serving as a negative electrode and the second electrode 34 serving as a positive electrode.

Figure 7:
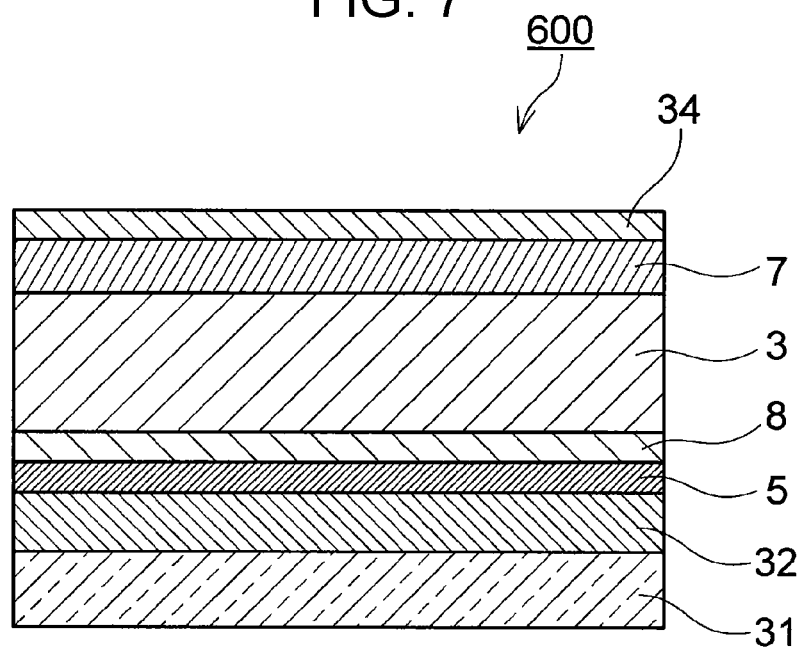
FIG. 7 is a schematic cross-sectional view of a solar cell according to a sixth example of the present disclosure.

FIG. 7 is a schematic cross-sectional view of a solar cell 600 according to the sixth example of the present embodiment. Unlike the solar cell 500 illustrated in FIG. 6, the solar cell 600 includes a template layer 8. In the solar cell 600, the template layer 8 and the light-absorbing layer 3 may function as a light-absorbing layer. In other words, the light-absorbing layer may include the template layer 8 as a first layer and the light-absorbing layer 3 as a second layer. Components with the same function and structure as the solar cell 500 are denoted by the same reference numerals and will not be further described.

The solar cell 600 includes the first electrode 32, the electron-transport layer 5, the template layer 8, the light-absorbing layer 3, the hole-transport layer 7, and the second electrode 34 in this order on the substrate 31. The substrate 31 may be omitted in the solar cell 600.

Some basic operational advantages of the solar cell 600 according to the present embodiment will be described below.

Upon irradiation of the solar cell 600 with light, the light-absorbing layer 3 absorbs light and generates excited electrons and positive holes. The excited electrons are transferred to the electron-transport layer 5 via the template layer 8. The positive holes in the light-absorbing layer 3 are transferred to the hole-transport layer 7. The electron-transport layer 5 is connected to the first electrode 32, and the hole-transport layer 7 is connected to the second electrode 34. Thus, the solar cell 600 can generate an electric current from the first electrode 32 serving as a negative electrode and the second electrode 34 serving as a positive electrode.

The components of the solar cell 600 will be further described below. The components described for the solar cell 500 will not be described here.

Template Layer 8

The first layer, the template layer 8, contains a first compound represented by the composition formula $AMX_3$ and having a perovskite structure, wherein A denotes a monovalent cation, M denotes a divalent cation, and X denotes a halogen anion. The first compound has a composition different from $FASnI_3$, for example. In the first compound, the composition formula $AMX_3$ is $MASnI_3$ or $MAPbI_3$, for example. The template layer 8 may be formed of $MASnI_3$ or $MAPbI_3$. The template layer 8 has a thickness in the range of 50 to 1000 nm, for example. In the template layer 8, the crystals of the first compound may have the same orientation. In the template layer 8, the crystals of the first compound may have the (100) or (110) orientation. More specifically, in the template layer 8, the (100) or (110) plane of the crystals of the first compound may grow parallel to the interface between the template layer 8 and the electron-transport layer 5.

For example, the template layer 8 is formed on the electron-transport layer 5 of a layered body composed of the substrate 31, the first electrode 32, and the electron-transport layer 5. The template layer 8 can be formed by the method described in the first embodiment.

Light-Absorbing Layer 3

As described above, the second layer, the light-absorbing layer 3, contains at least one of the light-absorbing materials according to Embodiments A to E of the first embodiment. Thus, the light-absorbing layer 3 contains a second compound represented by $FASnI_3$ and having a perovskite structure. The first compound and the second compound have different compositions. In the light-absorbing layer 3, the crystals of the second compound may have the same orientation. In the light-absorbing layer 3, the crystals of the second compound may have the (100) or (110) orientation. Thus, in the light-absorbing layer 3, the (100) or (110) plane of the crystals of the second compound may grow parallel to the interface between the light-absorbing layer 3 and the template layer 8. The crystals of the first compound in the template layer 8 may have the same orientation as the crystals of the second compound in the light-absorbing layer 3.

For example, the light-absorbing layer 3 is formed on the template layer 8 of a layered body composed of the substrate 31, the first electrode 32, the electron-transport layer 5, and the template layer 8. The light-absorbing layer 3 can be formed by dipping the layered body in a heated solution to grow crystals. The solution used in this method is the solution used in the production of the perovskite compound FASnI$_3$ of the first embodiment by the liquid phase epitaxy method as described in the first embodiment.

Figure 8:
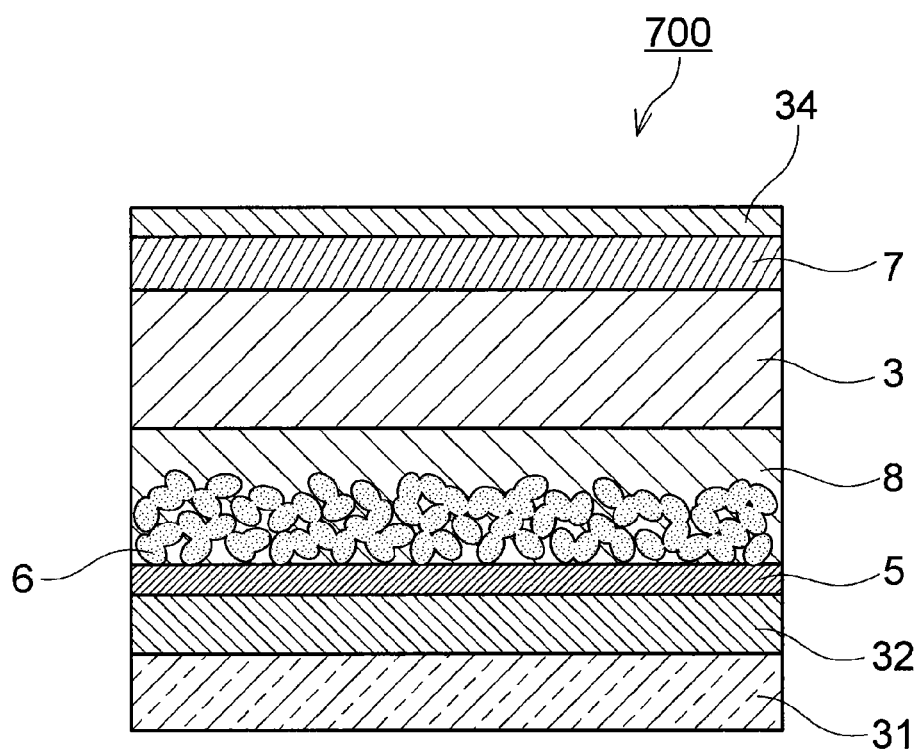
FIG. 8 is a schematic cross-sectional view of a solar cell according to a seventh example of the present disclosure.

FIG. 8 is a schematic cross-sectional view of a solar cell 700 according to the seventh example of the present embodiment. Unlike the solar cell 600 illustrated in FIG. 7, the solar cell 700 includes a porous layer 6. Components with the same function and structure as the solar cell 600 are denoted by the same reference numerals and will not be further described.

The solar cell 700 includes the first electrode 32, the electron-transport layer 5, the porous layer 6, the template layer 8, the light-absorbing layer 3, the hole-transport layer 7, and the second electrode 34 in this order on the substrate 31. The porous layer 6 includes a porous body. The porous body includes pores. The substrate 31 may be omitted in the solar cell 700.

The pores in the porous layer 6 communicate with the template layer 8 and the electron-transport layer 5. Thus, the material of the template layer 8 can fill the pores of the porous layer 6 and reach the electron-transport layer 5. Thus, the template layer 8 is in contact with the electron-transport layer 5, and electrons can be directly transferred between the template layer 8 and the electron-transport layer 5.

Some basic operational advantages of the solar cell 700 will be described below. Upon irradiation of the solar cell 700 with light, the light-absorbing layer 3 absorbs light and generates excited electrons and positive holes. The excited electrons are transferred to the electron-transport layer 5 via the template layer 8. The positive holes in the light-absorbing layer 3 are transferred to the hole-transport layer 7. The electron-transport layer 5 is connected to the first electrode 32, and the hole-transport layer 7 is connected to the second electrode 34. Thus, the solar cell 700 can generate an electric current from the first electrode 32 serving as a negative electrode and the second electrode 34 serving as a positive electrode.

The porous layer 6 on the electron-transport layer 5 facilitates the formation of the template layer 8. More specifically, the material of the template layer 8 enters the pores of the porous layer 6, and the porous layer 6 serves as a scaffold of the template layer 8. Thus, the material of the template layer 8 is rarely repelled by the porous layer 6 or rarely aggregates. Thus, the template layer 8 can be uniformly formed. For example, the template layer 8 in the solar cell 700 can be formed by applying a solution to the porous layer 6 of a layered body composed of the substrate 31, the first electrode 32, the electron-transport layer 5, and the porous layer 6 and heat-treating the solution. The solution used in this method may be the second solution or the third solution described in the first embodiment.

Porous Layer 6

The porous layer 6 serves as a base for the template layer 8 and for the light-absorbing layer 3. The porous layer 6 does not prevent light absorption of the light-absorbing layer 3 or electron transfer from the light-absorbing layer 3 to the template layer 8 and to the electron-transport layer 5.

The porous layer 6 includes a porous body. The porous body may be composed of insulating or semiconductor particles. The insulating particles may be aluminum oxide or silicon oxide particles. The semiconductor particles may be inorganic semiconductor particles. Examples of the inorganic semiconductor include oxides of metal elements, perovskite oxides of metal elements, sulfides of metal elements, and metal chalcogenides. Examples of the oxides of metal elements include oxides of Cd, Zn, In, Pb, Mo, W, Sb, Bi, Cu, Hg, Ti, Ag, Mn, Fe, V, Sn, Zr, Sr, Ga, Si, and Cr. More specifically, TiO$_2$ may be used. Examples of the perovskite oxides of metal elements include SrTiO$_3$ and CaTiO$_3$. Examples of the sulfides of metal elements include CdS, ZnS, In$_2$S$_3$, PbS, Mo$_2$S, WS$_2$, Sb$_2$S$_3$, Bi$_2$S$_3$, ZnCdS$_2$, and Cu$_2$S. Examples of the metal chalcogenides include CsSe, In$_2$Se$_3$, WSe$_2$, HgS, PbSe, and CdTe.

The porous layer 6 may have a thickness in the range of 0.01 to 10 μm or 0.1 to 1 μm. The porous layer 6 may have a rough surface. More specifically, the surface roughness factor given by the effective area/projected area ratio may be 10 or more or 100 or more. The projected area refers to the area of a shadow of an object illuminated with light from the front. The effective area refers to the actual surface area of the object. The effective area can be calculated from the volume determined from the projected area and thickness of the object and the specific surface area and bulk density of the material of the object. The specific surface area is measured by a nitrogen adsorption method, for example.

Template Layer 8

The template layer 8 contains the first compound. The template layer 8 may be formed of MASnI$_3$ or MAPbI$_3$. For example, the template layer 8 is formed on the porous layer 6 of a layered body composed of the substrate 31, the first electrode 32, the electron-transport layer 5, and the porous layer 6. The template layer 8 can be formed by the method described in the first embodiment.

Light-Absorbing Layer 3

The light-absorbing layer 3 contains at least one of the light-absorbing materials according to Embodiments A to E of the first embodiment. For example, the light-absorbing layer 3 is formed on the template layer 8 of a layered body composed of the substrate 31, the first electrode 32, the electron-transport layer 5, and the template layer 8. The light-absorbing layer 3 can be formed by dipping the layered body in a heated solution to grow crystals. The solution used in this method is the solution used in the production of the perovskite compound FASnI$_3$ of the first embodiment by the liquid phase epitaxy method as described in the first embodiment.

EXAMPLES

In the examples and comparative examples, perovskite compounds (hereinafter referred to simply as "compounds") were produced and tested for physical properties. Solar cells were produced using the perovskite compounds and were also tested.

Production of Compounds of Examples and Comparative Examples

Example 1

First, a GVL solution containing SnI$_2$ and FAI was prepared. The concentration of SnI$_2$ in the GVL solution was 1 mol/L. The concentration of FAI in the GVL solution was 1 mol/L. The GVL solution was then applied to a substrate by spin coating at a rotational speed of 4000 rpm. The substrate was a glass substrate 0.7 mm in thickness. The substrate was then heat-treated on a hot plate at 100° C. for 10 minutes and on a hot plate at 180° C. for 15 minutes to form a sample that includes a FASnI$_3$ template layer on the substrate. The GVL solution and the sample were then heated to 100° C., and the high-temperature sample was dipped in the high-temperature GVL solution for 1 second. The sample was removed from the GVL solution and was heat-treated on a hot plate at 100° C. for 10 minutes and then on a hot plate at 180° C. for 15 minutes, thus producing a compound according to Example 1 (a FASnI$_3$ film).

Example 2

A compound according to Example 2 (a FASnI$_3$ film) was produced in the same manner as in Example 1 except that a MAPbI$_3$ template layer with the (100) orientation was formed instead of the FASnI$_3$ template layer. The MAPbI$_3$ template layer with the (100) orientation was formed by the following method. First, a DMSO solution containing PbI$_2$ and MAI was prepared. The concentration of PbI$_2$ in the DMSO solution was 1 mol/L. The concentration of MAI in the DMSO solution was 3 mol/L. The DMSO solution was then applied to a substrate by spin coating. The substrate was then heat-treated on a hot plate at 170° C. for 5 minutes to form a MAPbI$_3$ template layer with the (100) orientation on the substrate.

Example 3

A compound according to Example 3 (a FASnI$_3$ film) was produced in the same manner as in Example 1 except that a MAPbI$_3$ template layer with the (110) orientation was formed instead of the FASnI$_3$ template layer. The MAPbI$_3$ template layer with the (110) orientation was formed by the following method. First, a DMSO solution containing PbI$_2$ and MAI was prepared. The concentration of PbI$_2$ in the DMSO solution was 1 mol/L. The concentration of MAI in the DMSO solution was 1 mol/L. The solution was then applied to a substrate by spin coating. The substrate was then heat-treated on a hot plate at 130° C. for 10 minutes to form a MAPbI$_3$ template layer with the (110) orientation on the substrate.

Example 4

A compound according to Example 4 (a FASnI$_3$ film) was produced in the same manner as in Example 1 except that a MASnI$_3$ template layer with the (100) orientation was formed instead of the FASnI$_3$ template layer. The MASnI$_3$ template layer with the (100) orientation was formed by the following method. First, a DMSO:DMF=1:1 mixed solution containing SnI$_2$ and MAI was prepared. The concentration of SnI$_2$ in the mixed solution was 1 mol/L. The concentration of MAI in the mixed solution was 1 mol/L. The mixed solution was then applied to a substrate by spin coating. At this time, 200 μL of chlorobenzene was dropped on the rotating substrate. The substrate was then heat-treated on a hot plate at 100° C. for 10 minutes and on a hot plate at 180° C. for 15 minutes to form a MASnI$_3$ template layer with the (100) orientation on the substrate.

Example 5

A solar cell according to Example 5 was produced by the following method. The solar cell according to Example 5 had the same structure as the solar cell 600 according to the sixth example of the second embodiment (see FIG. 7). The components of the solar cell according to Example 5 are as follows:
  Substrate 31: glass substrate (thickness: 0.7 mm)
  First electrode 32: transparent electrode, indium-tin composite oxide layer (thickness: 100 nm) and antimony-doped tin oxide layer (thickness: 100 nm)
  Electron-transport layer 5: titanium oxide
  Template layer 8: MAPbI$_3$
  Light-absorbing layer 3: FASnI$_3$ (thickness: 5000 nm)
  Hole-transport layer 7: polytriallylamine (PTAA)
  Second electrode 34: Au (thickness: 80 nm)
The solar cell according to Example 5 was produced as described below.

First, a transparent conductive layer that functions as the first electrode 32 was formed on the substrate 31. In the present example, the substrate 31 was a glass substrate 0.7 mm in thickness. The first electrode 32 was composed of an indium-tin composite oxide layer and an antimony-doped tin oxide layer. More specifically, the indium-tin composite oxide layer of the first electrode 32 was located between the substrate 31 and the antimony-doped tin oxide layer of the first electrode 32.

A DMSO solution containing PbI$_2$ and MAI was then prepared. The concentration of PbI$_2$ in the DMSO solution was 1 mol/L. The concentration of MAI in the DMSO solution was 3 mol/L. The DMSO solution was then applied by spin coating to the first electrode 32 on the substrate 31 and was heat-treated on a hot plate at 130° C. for 5 minutes. A sample thus produced included the MAPbI$_3$ template layer 8 with the (100) orientation on the first electrode 32.

A GVL solution containing SnI$_2$ and FAI was then prepared. The concentration of SnI$_2$ in the GVL solution was 1 mol/L. The concentration of FAI in the GVL solution was 1 mol/L.

The GVL solution and the sample were then heated on a hot plate at 100° C. The sample heated to 100° C. was dipped for 1 second in the GVL solution heated to 100° C.

The sample was removed from the GVL solution and was heat-treated on a hot plate at 100° C. for 10 minutes and then on a hot plate at 180° C. for 15 minutes to form the light-absorbing layer 3. The light-absorbing layer 3 in the present example was produced by the method for producing the compound of Example 2 (the FASnI$_3$ film).

A toluene solution of 10 mg of PTAA in 1 mL of toluene was applied to the light-absorbing layer 3 by spin coating to form the hole-transport layer 7.

A Au film 80 nm in thickness was deposited on the hole-transport layer 7 by vacuum deposition to form the second electrode 34. In this manner, the solar cell according to Example 5 was produced.

Example 6

A compound according to Example 6 was produced as described below. The compound according to Example 6 (a FASnI$_3$ film) was produced in the same manner as in Example 1 except that in the application of the GVL solution containing SnI$_2$ and FAI on a substrate by spin coating, the rotational speed was decreased to 1000 rpm to increase the thickness of the template layer.

Example 7

A compound according to Example 7 was produced as described below. The GVL solution containing SnI$_2$ and FAI of Example 1 was heated to 180° C. on a hot plate. The high-temperature GVL solution was applied by spin coating to the MASnI$_3$ template layer of Example 4 on the substrate. The GVL solution was then heat-treated on a hot plate at 100° C. for 10 minutes and then on a hot plate at 180° C. for 15 minutes to produce the compound of Example 7 (a FASnI$_3$ film).

Comparative Example 1

First, a GVL solution containing SnI$_2$ and FAI was prepared. The concentration of SnI$_2$ in the GVL solution was 1 mol/L. The concentration of FAI in the GVL solution was 1 mol/L. The solution was then applied to a substrate by spin coating. The substrate was a glass substrate 0.7 mm in thickness. The substrate was then heat-treated on a hot plate at 100° C. for 10 minutes and on a hot plate at 180° C. for 15 minutes to produce a compound of Comparative Example 1 (a FASnI$_3$ film).

Comparative Example 2

A DMSO:DMF=1:1 mixed solution containing SnI$_2$ and FAI was prepared. The concentration of SnI$_2$ in the mixed solution was 1 mol/L. The concentration of FAI in the mixed solution was 1 mol/L. The mixed solution was then applied to a substrate by spin coating. At this time, 200 μL of chlorobenzene was dropped on the rotating substrate. The substrate was a glass substrate 0.7 mm in thickness. The substrate was then heat-treated on a hot plate at 100° C. for 10 minutes and on a hot plate at 180° C. for 15 minutes to produce a compound of Comparative Example 2 (a FASnI$_3$ Film)

Comparative Example 3

First, a DMSO:DMF=1:1 mixed solution containing SnI$_2$ and MAI was prepared. The concentration of SnI$_2$ in the mixed solution was 1 mol/L. The concentration of MAI in the mixed solution was 1 mol/L. The mixed solution was then applied to a substrate by spin coating. At this time, 200 μL of chlorobenzene was dropped on the rotating substrate. The substrate was a glass substrate 0.7 mm in thickness. The substrate was then heat-treated on a hot plate at 100° C. for 10 minutes and on a hot plate at 180° C. for 15 minutes to produce a compound of Comparative Example 3 (a MASnI$_3$ film).

Comparative Example 4

A solar cell according to Comparative Example 4 was produced by the following method. The components of the solar cell according to Comparative Example 4 are as follows:
Substrate: glass substrate (thickness: 0.7 mm)
First electrode: transparent electrode, indium-tin composite oxide layer (thickness: 100 nm) and antimony-doped tin oxide layer (thickness: 100 nm)
Electron-transport layer: titanium oxide
Light-absorbing layer: FASnI$_3$ (thickness: 500 nm)
Hole-transport layer: polytriallylamine (PTAA)
Second electrode: Au (thickness: 80 nm)
The solar cell according to Comparative Example 4 was produced as described below.
First, a transparent conductive layer that functions as the first electrode was formed on a base substrate. In this comparative example, the substrate was a glass substrate 0.7 mm in thickness. The first electrode was composed of an indium-tin composite oxide layer and an antimony-doped tin oxide layer. More specifically, the indium-tin composite oxide layer of the first electrode was located between the substrate and the antimony-doped tin oxide layer of the first electrode.

A DMSO:DMF=1:1 mixed solution containing SnI$_2$ and FAI was then prepared. The concentration of SnI$_2$ in the mixed solution was 1 mol/L. The concentration of FAI in the mixed solution was 1 mol/L. The mixed solution was then applied by spin coating to the first electrode on the base substrate. At this time, 200 μL of chlorobenzene was dropped on the rotating substrate. The substrate was then heat-treated on a hot plate at 100° C. for 10 minutes and on a hot plate at 180° C. for 15 minutes to form a FASnI$_3$ light-absorbing layer on the substrate. The light-absorbing layer in this comparative example was formed by the method for producing the compound of Comparative Example 2 (the FASnI$_3$ film).

A toluene solution of 10 mg of PTAA in 1 mL of toluene was applied to the light-absorbing layer by spin coating to form a hole-transport layer.

A Au film 80 nm in thickness was deposited on the hole-transport layer by vacuum deposition to form a second electrode. In this manner, the solar cell according to Comparative Example 4 was produced.

<Crystal Structure Analysis>

Figure 9:
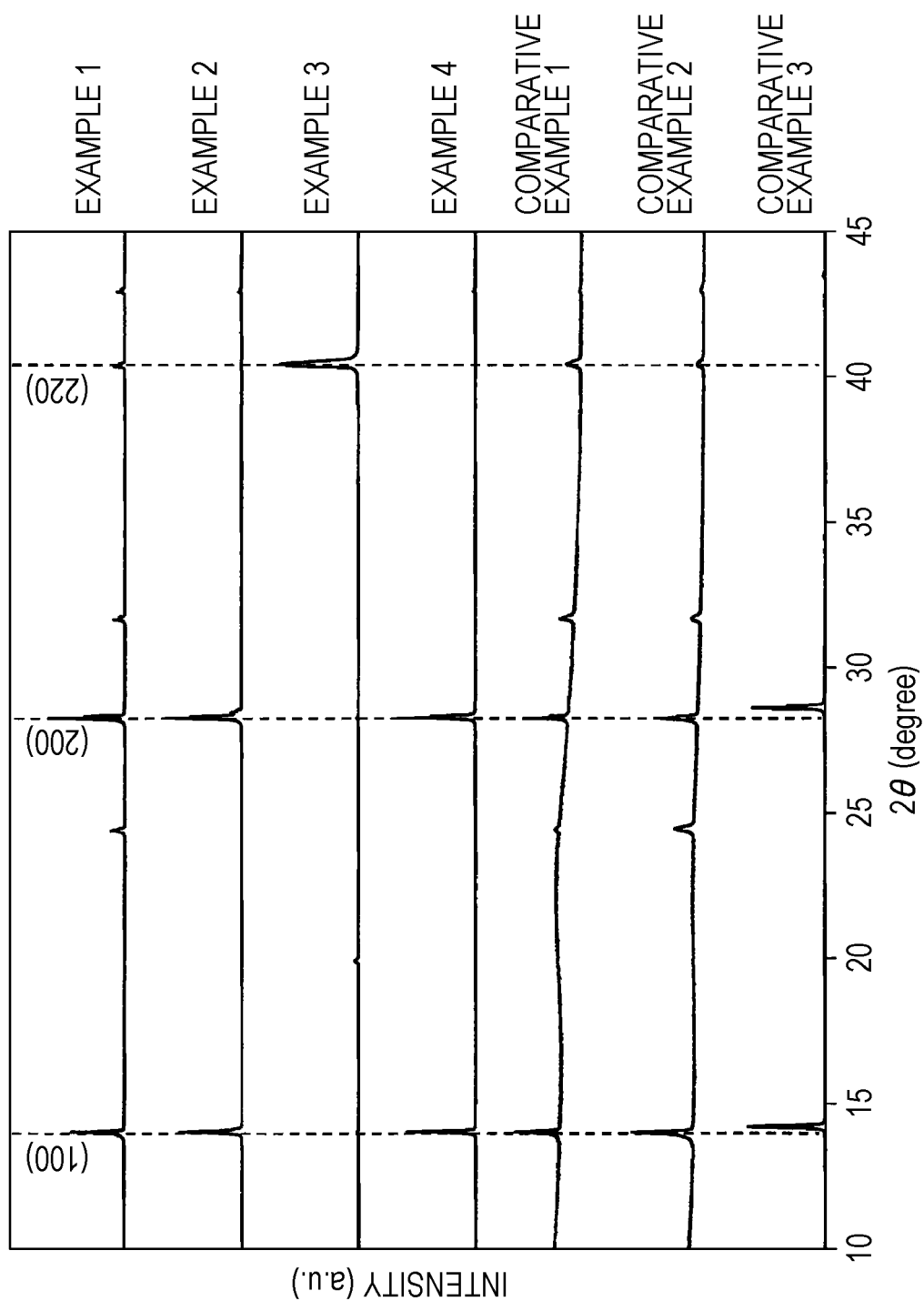
FIG. 9 shows X-ray diffraction patterns of perovskite compounds according to Examples 1 to 4 and Comparative Examples 1 to 3.

The compounds according to Examples 1 to 4 and Comparative Examples 1 to 3 were subjected to X-ray diffractometry (XRD) with Cu-Kα radiation. FIG. 9 shows XRD measurements for Examples 1 to 4 and Comparative Examples 1 to 3. The horizontal axis represents 2θ, and the vertical axis represents X-ray diffraction intensity. FIG. 9 shows that the compounds according to Examples 1 to 4 and Comparative Examples 1 to 3 had the perovskite structure. The compounds according to Examples 2 and 4 and Comparative Example 3 had the (100) orientation, and the compound according to Example 3 had the (110) orientation. In contrast, the results for Comparative Examples 1 and 2 show that a FASnI$_3$ film with a high degree of crystalline orientation cannot be produced by the known spin coating method. Although the MASnI$_3$ template layer with the (100) orientation was used in Example 4, a comparison of the XRD measurements for Example 4 and Comparative Example 3 shows that the MASnI$_3$-derived peak observed in Comparative Example 3 and a shifted peak thereof were not observed in Example 4. A FASnI$_3$ film with the (100) orientation was formed in Example 4, showing that the light-absorbing layer reflected the crystalline orientation of the template layer.

<Mobility Analysis>

The compounds according to Example 1 and Comparative Example 1 were subjected to mobility analysis. The spin-lattice relaxation time was measured by solid-state $^1$H-NMR spectroscopy under the following conditions. The spin-lattice relaxation time is a measure of molecular mobility. The spin-lattice relaxation time indicates the bond strength between the FA cation and SnI$_6$ octahedron.

Apparatus: JNM-ECZ600R/M1 manufactured by JEOL Ltd.
Observed nuclear: $^1$H
Measuring frequency: 600.172 MHz
Measurement temperature: 25° C.
Method of measurement: saturation recovery method
90-degree pulse width: 0.85 μs
Rotational speed of magic-angle spinning: 70 kHz
Waiting time for pulse application: 0.1 s
Number of scans: 64

The chemical shift was determined with respect to an external standard adamantane. In order to prevent deterioration caused by water in the air, a sample was placed in an airtight sample tube in a dry nitrogen stream in a dry atmosphere. The sample tube was 1 mm in diameter.

$^1$H-NMR measurements under these conditions showed a spectrum of the H atoms bonded to the N atom at 6.8 to 7.2 ppm. The relaxation time T1 was determined by fitting the peak intensity change at 6.8 to 7.2 ppm for different recovery times τ in pulse sequence to the following equation by the nonlinear least-squares method. M denotes the peak intensity.

$$M(\tau)=M(\infty)\{1-\exp(-\tau/T1)\}$$

Table 1 shows the results. Table 1 shows that the spin-lattice relaxation time was longer in Example 1 than in Comparative Example 1. This result shows that the bond strength between the FA cation and $SnI_6$ octahedron is stronger in Example 1 than in Comparative Example 1, suggesting that in Example 1 the $SnI_6$ octahedron confines the FA cation and restricts the molecular motion of the FA cation. The stronger force of the $SnI_6$ octahedron confining the FA cation increases the activation energy for returning to the most stable bonding state and stabilizes the metastable bonding state.

Thus, in the compound according to Example 1, the $SnI_6$ octahedron confines the FA cation and stabilizes the metastable bonding state, which does not exist in the compound according to Comparative Example 1. The measurements of spin-lattice relaxation time by the solid-state $^1$H-NMR spectroscopy have a measurement error of approximately 6 seconds. Thus, the compound according to Example 1 has a spin-lattice relaxation time in the range of 33 to 45 seconds.

TABLE 1

|  | Peak position (ppm) | Spin-lattice relaxation time (s) |
| --- | --- | --- |
| Example 1 | 6.87 | 39.2 |
| Comparative example 1 | 7.02 | 20.2 |

<Electronic State Analysis>

The compounds according to Example 1 and Comparative Example 1 were subjected to electronic state analysis. A $^1$H-$^{14}$N HMQC solid-state $^1$H-NMR spectrum was measured by two-dimensional NMR under the following conditions. The measurement can determine the electronic state of only the H atoms bonded to the N atom.

Apparatus: JNM-ECZ600R/M1 manufactured by JEOL Ltd.
Observed nuclear: $^1$H
Measurement frequency: 600.172 MHz
Measurement temperature: 25° C.
Method of measurement: magic-angle spinning (MAS)
Pulse sequence: $^1$H-$^{14}$N/HMQC
90-degree pulse width: 0.85 μs
Rotational speed of magic-angle spinning: 70 kHz
Waiting time for pulse application: 60 s
Number of scans: 64

The chemical shift was determined with respect to an external standard adamantane. In order to prevent deterioration caused by water in the air, a sample was placed in an airtight sample tube in a dry nitrogen stream in a dry atmosphere. The sample tube was 1 mm in diameter. The peaks were separated using the Voigt function.

Figure 10A:
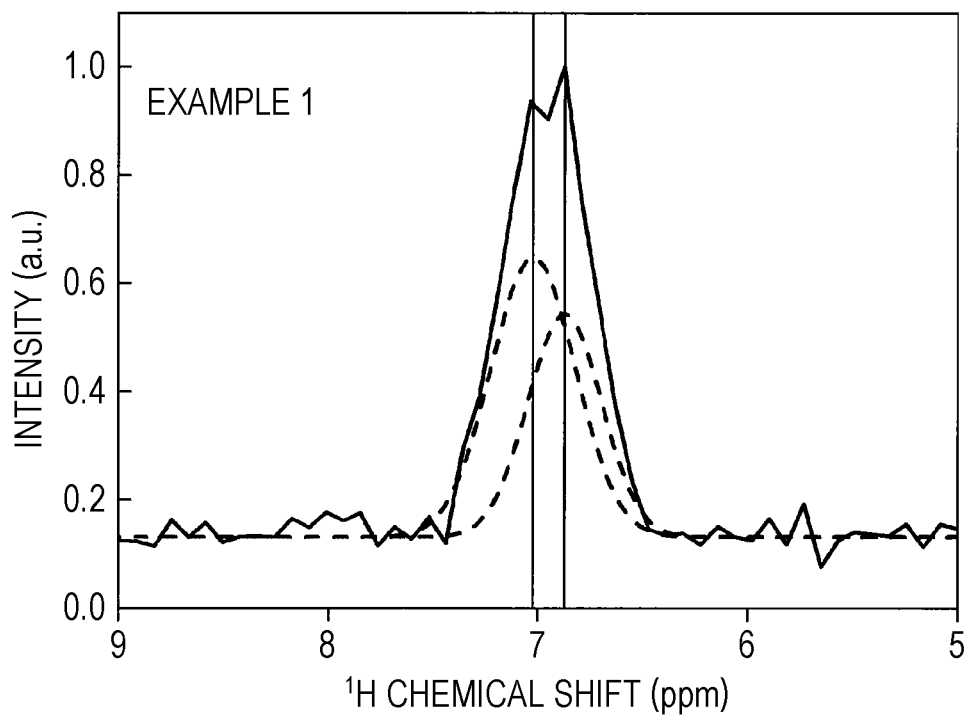
FIG. 10A is a $^1$H-$^{14}$N HMQC solid-state $^1$H-NMR spectrum in two-dimensional NMR of the perovskite compound according to Example 1.
Figure 10B:
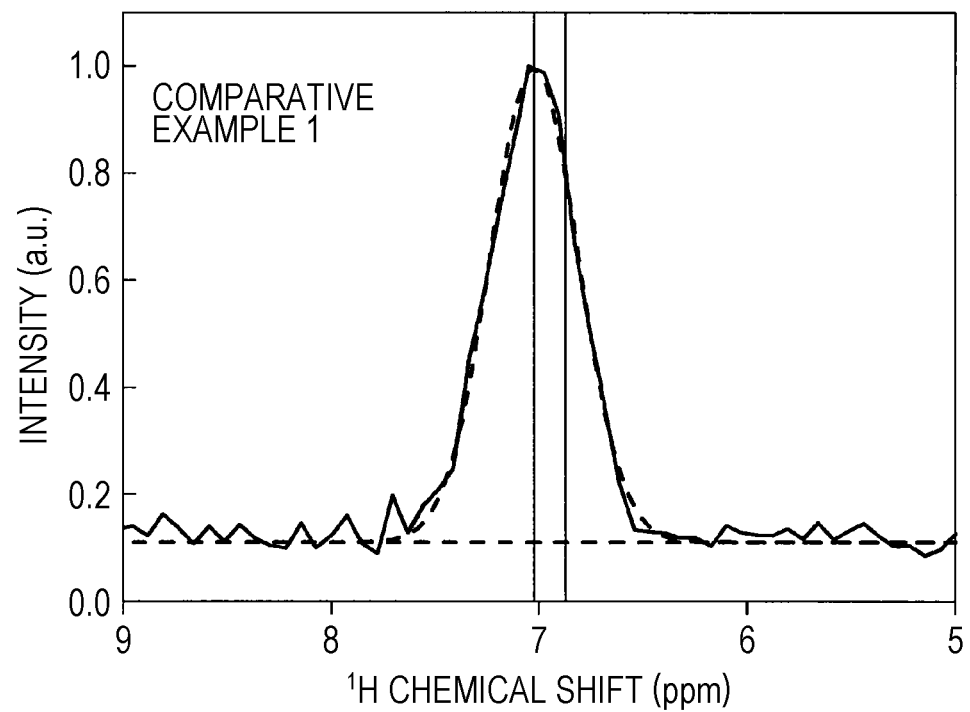
FIG. 10B is a $^1$H-$^{14}$N HMQC solid-state $^1$H-NMR spectrum in two-dimensional NMR of the perovskite compound according to Comparative Example 1.

FIG. 10A shows the measurement for Example 1. FIG. 10B shows the measurement for Comparative Example 1. The solid lines indicate the actual values, and the broken lines indicate the peak fitting results based on the actual values. Example 1 had a peak (7.02 ppm) as in Comparative Example 1 and an upfield peak (6.87 ppm), which was not observed in Comparative Example 1. The chemical shift to a higher magnetic field indicates that the bonding state is energetically metastable.

The intensity ratio $I_1/I_2$ of spectral intensity $I_1$ at 6.9 ppm to spectral intensity $I_2$ at 7.0 ppm was determined in Example 1 and Comparative Example 1. The intensity ratio $I_1/I_2$ was 104% in Example 1, which was greater than 75% in Comparative Example 1. This suggests the presence of the peak at 6.9 ppm in Example 1, which does not exist in Comparative Example 1. The intensity ratio $I_1/I_2$ of spectral intensity $I_1$ at 6.9 ppm to spectral intensity $I_2$ at 7.0 ppm includes a measurement error of approximately 5%.

The peaks in the measurements are assigned to the H atoms bonded to the N atom in the FA cation. The presence of the two peaks in Example 1 indicates the presence of the FA cation with another bonding state different from the bonding state in Comparative Example 1.

<Measurement of Optical Characteristics>

The compounds according to Example 1 and Comparative Example 1 were subjected to absorbance measurement and fluorescence measurement, and the bandgap was calculated from absorption edge energy.

Figure 11:
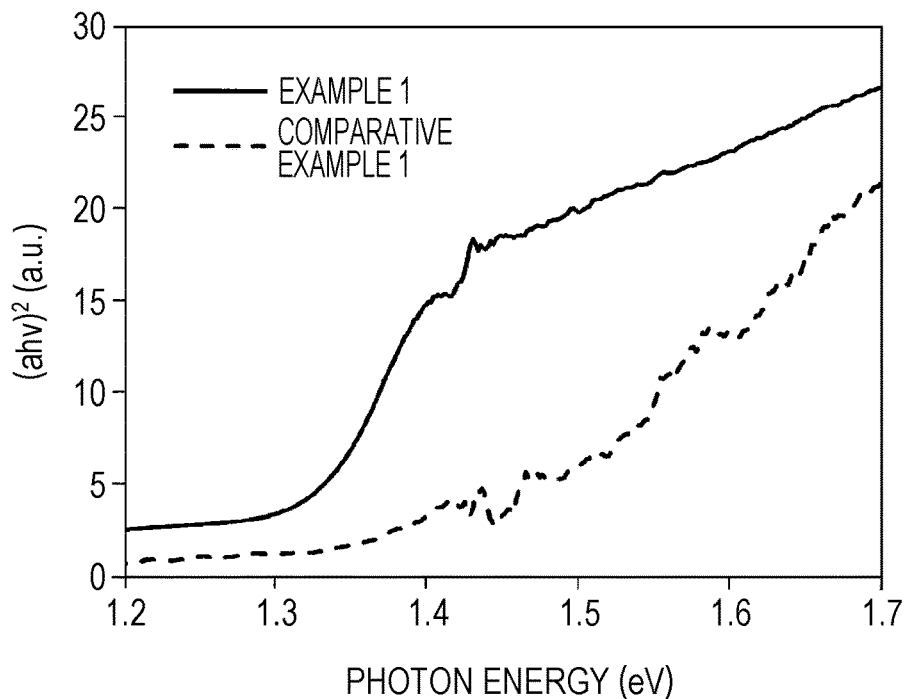
FIG. 11 shows absorption spectra of the perovskite compounds according to Example 1 and Comparative Example 1.

FIG. 11 shows the Tauc plots of the compounds according to Example 1 (solid line) and Comparative Example 1 (broken line). The horizontal axis represents photon energy (hv), and the vertical axis represents the square of αhv. α denotes the absorption coefficient. The figure shows that the absorption edge energy corresponding to the bandgap of the compound according to Comparative Example 1 is 1.42 eV, which is almost equal to 1.41 eV of a known film reported in Non-patent Literature 1. On the other hand, the absorption edge energy of the compound according to Example 1 is 1.35 eV. Thus, the absorption edge energy of the compound is located at a longer wavelength (lower energy) in Example 1 than in Comparative Example 1.

Figure 12:
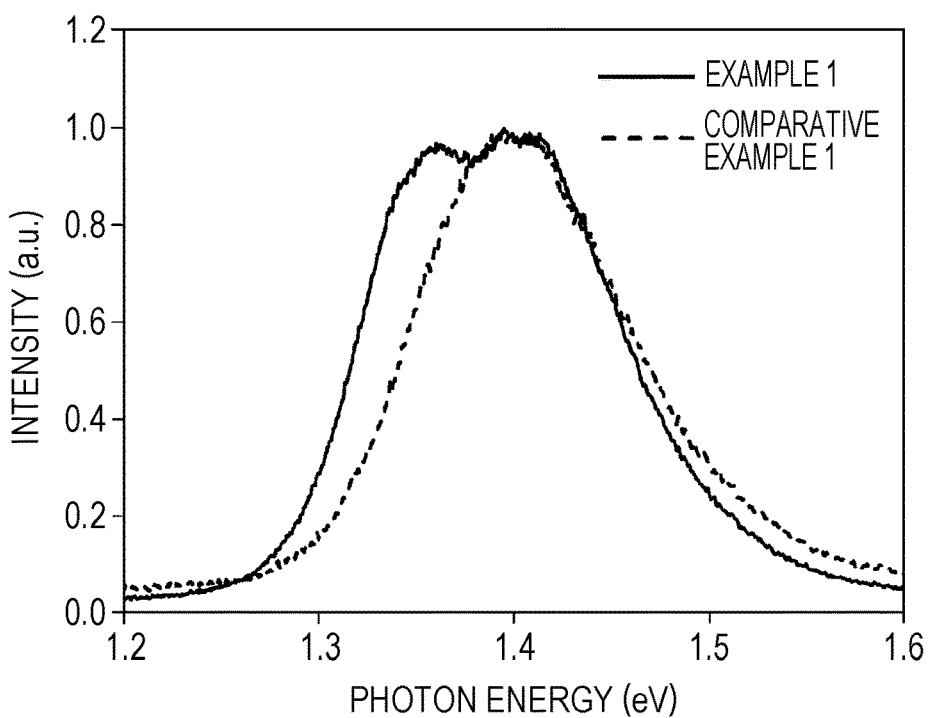
FIG. 12 shows fluorescence spectra of the perovskite compounds according to Example 1 and Comparative Example 1.

FIG. 12 shows the fluorescence spectra obtained by the fluorescence measurement of the compounds according to Example 1 (solid line) and Comparative Example 1 (broken line). A 532-nm laser light source was used in the fluorescence measurement. The horizontal axis represents photon energy, and the vertical axis represents fluorescence intensity. The figure shows that the fluorescence spectrum of the compound according to Comparative Example 1 has a peak at 1.42 eV. On the other hand, the fluorescence spectrum of the compound according to Example 1 has a peak at 1.35 eV in addition to the peak at 1.42 eV. Thus, the presence of the fluorescence peak at 1.35 eV shows that the peak of the fluorescence spectrum is located at a longer wavelength (lower energy) in the compound according to Example 1 than in the compound according to Comparative Example 1.

Light absorption and light emission at 1.35 eV by the compound according to Example 1 result from the metastable FA cation bonded in the direction that does not exist in the compound according to Comparative Example 1. The presence of the metastable FA cation decreases the bandgap from 1.42 eV to approximately 1.35 eV. As shown in FIG. 1, a bandgap decrease from 1.42 eV to 1.35 eV results in improved theoretical efficiency of the solar cell from 33.1% to 33.6%.

Figure 14:
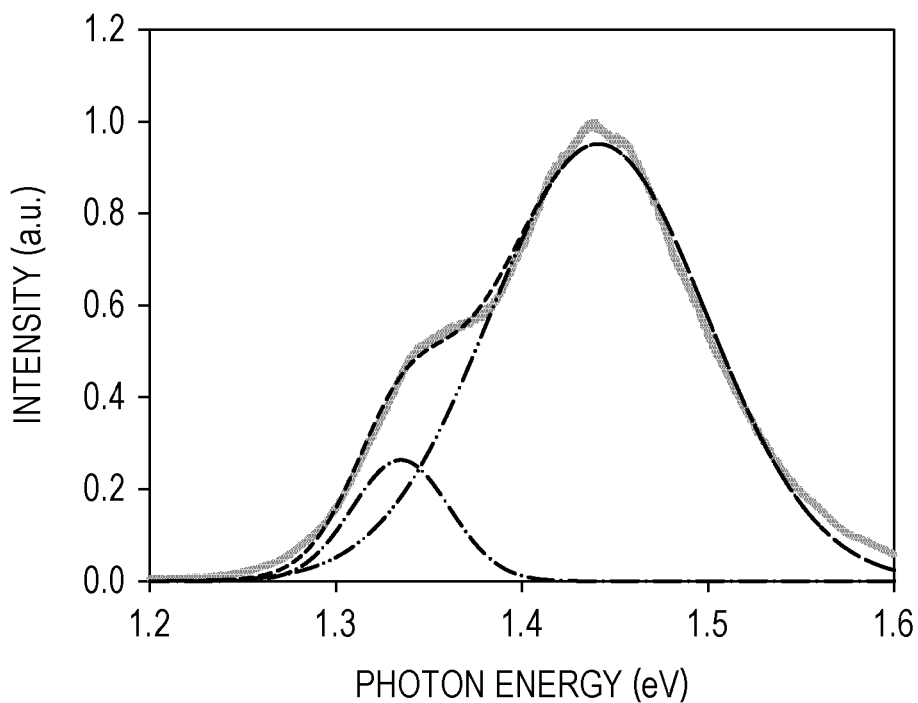
FIG. 14 shows fluorescence spectra of a perovskite compound according to Example 6.
Figure 15:
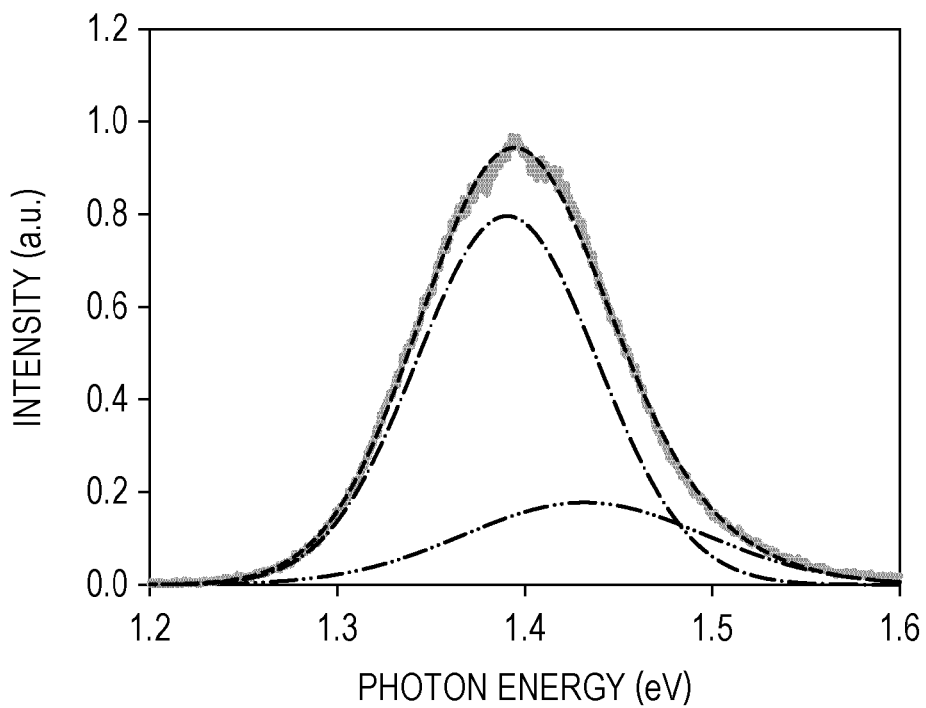
FIG. 15 shows fluorescence spectra of a perovskite compound according to Example 7.

The compounds according to Examples 6 and 7 were subjected to fluorescence measurement. FIG. 14 shows fluorescence spectra of the compound according to Example 6 obtained by the fluorescence measurement. FIG. 15 shows fluorescence spectra of the compound according to Example 7 obtained by the fluorescence measurement. A 532-nm laser light source was used in the fluorescence measurement. In FIGS. 14 and 15, the solid lines indicate the actual values, and the broken lines indicate the peak fitting results based on the actual values. In each of FIGS. 14 and 15, the peak fitting result indicated by the broken line is a sum of two peaks. One of the two peaks is indicated by a long dashed dotted line, and the other of the two peaks is indicated by a long dashed double-dotted line.

FIG. 14 shows that the fluorescence spectrum of the compound according to Example 6 has a peak at 1.33 eV indicated by the long dashed dotted line in addition to a peak at 1.42 eV indicated by the long dashed double-dotted line. The fluorescence intensity of the peak at 1.33 eV indicated by the long dashed dotted line was 27.7% of the fluorescence intensity of the peak at 1.42 eV indicated by the long dashed double-dotted line. FIG. 15 shows that the fluorescence spectrum of the compound according to Example 7 has a peak at 1.39 eV indicated by the long dashed dotted line in addition to a peak at 1.42 eV indicated by the long dashed double-dotted line.

<Characterization of Solar Cell>

The solar cells according to Example 5 and Comparative Example 4 were subjected to incident photon to current conversion efficiency (IPCE: quantum efficiency at each wavelength) measurement. The energy of the light source was 5 mW/cm$^2$ at each wavelength.

Figure 13:
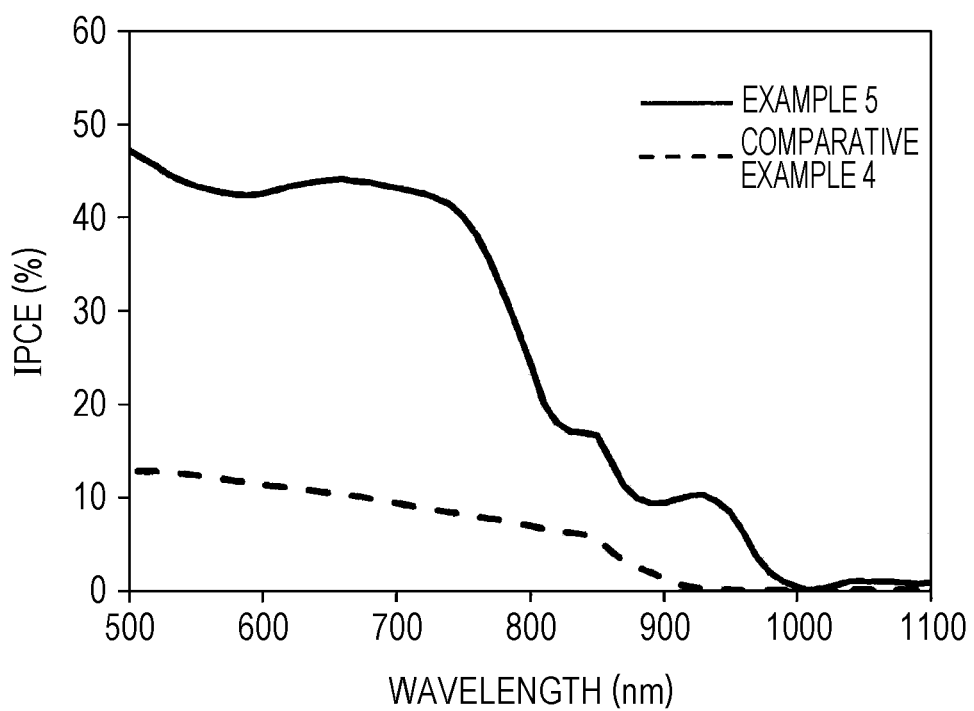
FIG. 13 is a graph showing the external quantum efficiency of perovskite solar cells according to Example 5 and Comparative Example 4.

FIG. 13 shows the results for Example 5 (solid line) and Comparative Example 4 (broken line), wherein the vertical axis represents external quantum efficiency, and the horizontal axis represents wavelength. Example 5 and Comparative Example 4 function as solar cells. The solar cell according to Comparative Example 4 had an absorption edge wavelength of 900 nm, which is identical with the absorption edge wavelength (900 nm) of the solar cell including a known FASnI$_3$ film illustrated in FIG. S9 of Non-patent Literature 1. Although the absolute values cannot be compared due to different thicknesses of the light-absorbing layers, the absorption wavelength range of the solar cell according to Example 5 extends to a longer wavelength than that of the solar cell according to Comparative Example 4, indicating that the light-absorbing layer in Example 5 has a smaller bandgap. Thus, in Example 5, carriers generated by light absorption in the long-wavelength range shown by the optical measurements are successfully taken out.

Thus, in the solar cell including the light-absorbing layer containing the compound according to Example 1, the compound according to Example 1 can improve the conversion efficiency of the solar cell.

What is claimed is:

1. A light-absorbing material comprising:
a compound represented by a composition formula HC(NH$_2$)$_2$SnI$_3$ and comprising a perovskite crystal structure in which an organic molecule in the perovskite crystal structure is provided in a metastable bonding state, the compound being produced by inverse temperature crystallization using γ-valerolactone as a solvent, wherein:
a solid-state $^1$H-NMR spectrum, which is obtained by $^1$H-$^{14}$N HMQC measurement in two-dimensional NMR at 25° C., of the compound includes a first peak at 6.9 ppm and a second peak at 7.0 ppm, and
a peak intensity of the first peak is equal to 80% or more of a peak intensity of the second peak.

2. The light-absorbing material according to claim 1, wherein:
the compound contains crystals, and
the crystals have the same orientation.

3. A solar cell comprising:
a first electrode;
a second electrode facing the first electrode; and
a light-absorbing layer that is disposed between the first electrode and the second electrode and generates electric charges by photoelectric conversion, wherein:
at least one electrode selected from the group consisting of the first electrode and the second electrode is light-transmissive,
the light-absorbing layer contains a light-absorbing material,
the light-absorbing material contains a compound represented by a composition formula HC(NH$_2$)$_2$SnI$_3$ and comprising a perovskite crystal structure in which an organic molecule in the perovskite crystal structure is provided in a metastable bonding state, the compound being produced by inverse temperature crystallization using γ-valerolactone as a solvent,
a solid-state $^1$H-NMR spectrum, which is obtained by $^1$H-$^{14}$N HMQC measurement in two-dimensional NMR at 25° C., of the compound includes a first peak at 6.9 ppm and a second peak at 7.0 ppm, and
a peak intensity of the first peak is equal to 80% or more of a peak intensity of the second peak.

4. A light-absorbing material comprising:
a compound represented by a composition formula HC(NH$_2$)$_2$SnI$_3$, comprising a perovskite crystal structure in which an organic molecule in the perovskite crystal structure is provided in a metastable bonding state, the compound being produced by inverse temperature crystallization using γ-valerolactone as a solvent, and having a spin-lattice relaxation time T1 of 33 seconds or more and 45 seconds or less at 25° C. as measured by solid-state $^1$H-NMR spectroscopy.

5. The light-absorbing material according to claim 4, wherein
the compound contains crystals, and
the crystals have the same orientation.

6. A solar cell comprising:
a first electrode;
a second electrode facing the first electrode; and
a light-absorbing layer that is disposed between the first electrode and the second electrode and generates electric charges by photoelectric conversion, wherein:
at least one electrode selected from the group consisting of the first electrode and the second electrode is light-transmissive,
the light-absorbing layer contains a light-absorbing material, and
the light-absorbing material contains a compound represented by a composition formula HC(NH$_2$)$_2$SnI$_3$, comprising a perovskite crystal structure in which an organic molecule in the perovskite crystal structure is provided in a metastable bonding state, the compound being produced by inverse temperature crystallization using γ-valerolactone as a solvent, and having a spin-lattice relaxation time T1 of 33 seconds or more and 45 seconds or less at 25° C. as measured by solid-state $^1$H-NMR spectroscopy.

7. A light-absorbing material comprising:
a compound represented by a composition formula HC(NH$_2$)$_2$SnI$_3$ and comprising a perovskite crystal structure in which an organic molecule in the perovskite crystal structure is provided in a metastable bonding state, the compound being produced by inverse temperature crystallization using γ-valerolactone as a solvent, wherein:

a fluorescence spectrum of the compound has a peak in a range of 1.33 eV or more and 1.39 eV or less.

8. The light-absorbing material according to claim 7, wherein the compound contains crystals, and the crystals have the same orientation.

9. A solar cell comprising:

a first electrode;

a second electrode facing the first electrode; and a light-absorbing layer that is disposed between the first electrode and the second electrode and generates electric charges by photoelectric conversion, wherein:

at least one electrode selected from the group consisting of the first electrode and the second electrode is light-transmissive, the light-absorbing layer contains a light-absorbing material, the light-absorbing material contains a compound represented by a composition formula $HC(NH_2)_2SnI_3$ and comprising a perovskite crystal structure in which an organic molecule in the perovskite crystal structure is provided in a metastable bonding state, the compound being produced by inverse temperature crystallization using γ-valerolactone as a solvent, and a fluorescence spectrum of the compound has a peak in a range of 1.33 eV or more and 1.39 eV or less.

10. The light-absorbing material according to claim 1, wherein the compound has a bandgap in a range of 1.33 eV or more and 1.39 eV or less at 25° C.

11. The light-absorbing material according to claim 4, wherein the compound has a bandgap in a range of 1.33 eV or more and 1.39 eV or less at 25° C.

12. The light-absorbing material according to claim 7, wherein the compound has a bandgap in a range of 1.33 eV or more and 1.39 eV or less at 25° C.

* * * * *